(12) United States Patent
Ohashi et al.

(10) Patent No.: US 7,524,451 B2
(45) Date of Patent: Apr. 28, 2009

(54) METHOD OF MANUFACTURING AN INSULATING TARGET MATERIAL

(75) Inventors: Koji Ohashi, Chino (JP); Setsuya Iwashita, Nirasaki (JP); Takeshi Kijima, Matsumoto (JP); Yasuaki Hamada, Suwa (JP)

(73) Assignee: Seiko Epson Corporation (JP)

( * ) Notice: Subject to any disclaimer, the term of this patent is extended or adjusted under 35 U.S.C. 154(b) by 220 days.

(21) Appl. No.: 11/504,255

(22) Filed: Aug. 15, 2006

(65) Prior Publication Data

US 2007/0040243 A1 Feb. 22, 2007

(30) Foreign Application Priority Data

Aug. 16, 2005 (JP) .............................. 2005-235809

(51) Int. Cl.
*B28B 1/00* (2006.01)
(52) U.S. Cl. .................. 264/658; 264/653; 264/654
(58) Field of Classification Search ................. 264/653, 264/654, 658
See application file for complete search history.

(56) References Cited

U.S. PATENT DOCUMENTS

| 2007/0045109 A1* | 3/2007 | Kijima et al. | .......... 204/298.13 |
| 2007/0163879 A1* | 7/2007 | Ohashi et al. | .......... 204/298.13 |
| 2007/0170053 A1* | 7/2007 | Ohashi et al. | .......... 204/298.13 |

FOREIGN PATENT DOCUMENTS

| EP | 1 557 481 A2 * | 7/2005 |
| JP | 10-176264 | 6/1998 |
| JP | 2003-063860 | 3/2003 |
| JP | 2004-076021 | 3/2004 |
| JP | 2004-211159 | 7/2004 |
| JP | 2005-216704 | 8/2005 |

* cited by examiner

*Primary Examiner*—Steven P Griffin
*Assistant Examiner*—Russell J Kemmerle, III
(74) *Attorney, Agent, or Firm*—Harness, Dickey & Pierce, P.L.C.

(57) ABSTRACT

An insulating target material for obtaining a conductive complex oxide film represented by a general formula $ABO_3$, the insulating target material including an oxide of an element A, an oxide of an element B, and at least one of an Si compound and a Ge compound.

5 Claims, 25 Drawing Sheets

FIG.4

| HEAT TREATMENT | 2θ (100) | SEM | OUTWARD APPEAR- ANCE |
|---|---|---|---|
| AsDepo | 400 CPS | ○ | ○ |
| 700~800°C /O2 | 500 CPS | ○ | ○ |
| 700~800°C /Ar or N2 | 500 CPS | ○ | ○ |

LNSO FILM 1

FIG.8

| HEAT TREATMENT | 2θ (100) | SEM | OUTWARD APPEAR-ANCE |
|---|---|---|---|
| AsDepo | 200 CPS | ○ | ○ |
| 700~800°C /O2 | 400 CPS | × | × |
| 700~800°C /Ar or N2 | 400 CPS | ○ | × |

FIG.13

| HEAT TREATMENT | 2θ (100) | SEM |
|---|---|---|
| AsDepo | 300 CPS | ○ |
| 700~800°C /O2 | 600 CPS | ○ |
| 700~800°C /Ar or N2 | 500 CPS | ○ | a: —— SILICATE ADDITION AsDepo
b: —— SILICATE ADDITION 800°C/O2
c: —— NO ADDITION

METHOD OF MANUFACTURING AN INSULATING TARGET MATERIAL

Japanese Patent Application No. 2005-235809, filed on Aug. 16, 2005, is hereby incorporated by reference in its entirety.

BACKGROUND OF THE INVENTION

The present invention relates to an insulating target material suitably used for radio frequency (RF) sputtering, a method of manufacturing the insulating target material, a conductive complex oxide film, and a device.

A target for obtaining a complex oxide film by sputtering is generally obtained as follows. For example, a target for obtaining a perovskite oxide film of the general formula $ABO_3$ is obtained by pulverizing oxide raw materials of the element A and the element B, mixing the oxide raw materials taking the stoichiometric composition into consideration, and sintering the mixture. A material disclosed in JP-A-10-176264 has been known as such a target, for example. This document discloses a sputtering target for a perovskite oxide of the chemical formula $ABO_3$ which has a specific relative density and size.

On the other hand, the inventor of the invention found that a target sufficient for obtaining a conductive complex oxide film of the general formula $ABO_3$ cannot be obtained by merely pulverizing oxide raw materials of the element A and the element B and mixing and sintering the oxide raw materials at a specific composition.

For example, the inventor formed a target for forming an $LaNiO_3$ conductive complex oxide film by RF sputtering using a known sintering method to obtain the following findings. Specifically, a target obtained by mixing an La oxide powder and an Ni oxide powder at a composition ratio of 1:1 and sintering the mixture did not exhibit uniform insulating properties over the entire target, in which a portion exhibiting low insulating properties (i.e. portion exhibiting conductivity higher than that of the surrounding portion) was formed. When RF sputtering is performed using such a target, plasma is concentrated on the portion exhibiting low insulating properties, whereby the portion on which the plasma is concentrated may be dissolved or cracks may occur in the target due to plasma concentration. This makes it difficult to use such a target for RF sputtering.

SUMMARY

According to a first aspect of the invention, there is provided an insulating target material for obtaining a conductive complex oxide film represented by a general formula $ABO_3$, the insulating target material comprising:
an oxide of an element A;
an oxide of an element B; and
at least one of an Si compound and a Ge compound.

According to a second aspect of the invention, there is provided a method of manufacturing an insulating target material for obtaining a conductive complex oxide film represented by a general formula $ABO_3$, the method comprising:
mixing an oxide of an element A and an oxide of an element B, heat-treating the resulting mixed powder, and pulverizing the resulting product to obtain a first powder;
mixing the first powder and a solution including at least one of an Si raw material and a Ge raw material, and collecting the resulting powder to obtain a second powder;
heat-treating the second powder and pulverizing the resulting product to obtain a third powder; and
heat-treating the third powder.

According to a third aspect of the invention, there is provided a conductive complex oxide film, being formed by RF sputtering method using the above-described insulating target material.

According to a fourth aspect of the invention, there is provided a device, comprising:
a base; and
the above-described conductive complex oxide film formed above the base.

According to a fifth aspect of the invention, there is provided an insulating target material, comprising:
an oxide of a first element;
an oxide of a second element; and
at least one of an Si compound and a Ge compound.

BRIEF DESCRIPTION OF THE SEVERAL VIEWS OF THE DRAWING

FIG. 4 is a view showing heat treatment and evaluation results of a conductive complex oxide film of Example 2 of the invention.

FIG. 8 is a view showing heat treatment and evaluation results of a conductive complex oxide film of Comparative Example 2.

FIG. 13 is a view showing heat treatment and evaluation results of a conductive complex oxide film of Example 3 of the invention.

DETAILED DESCRIPTION OF THE EMBODIMENT

Figure 1:
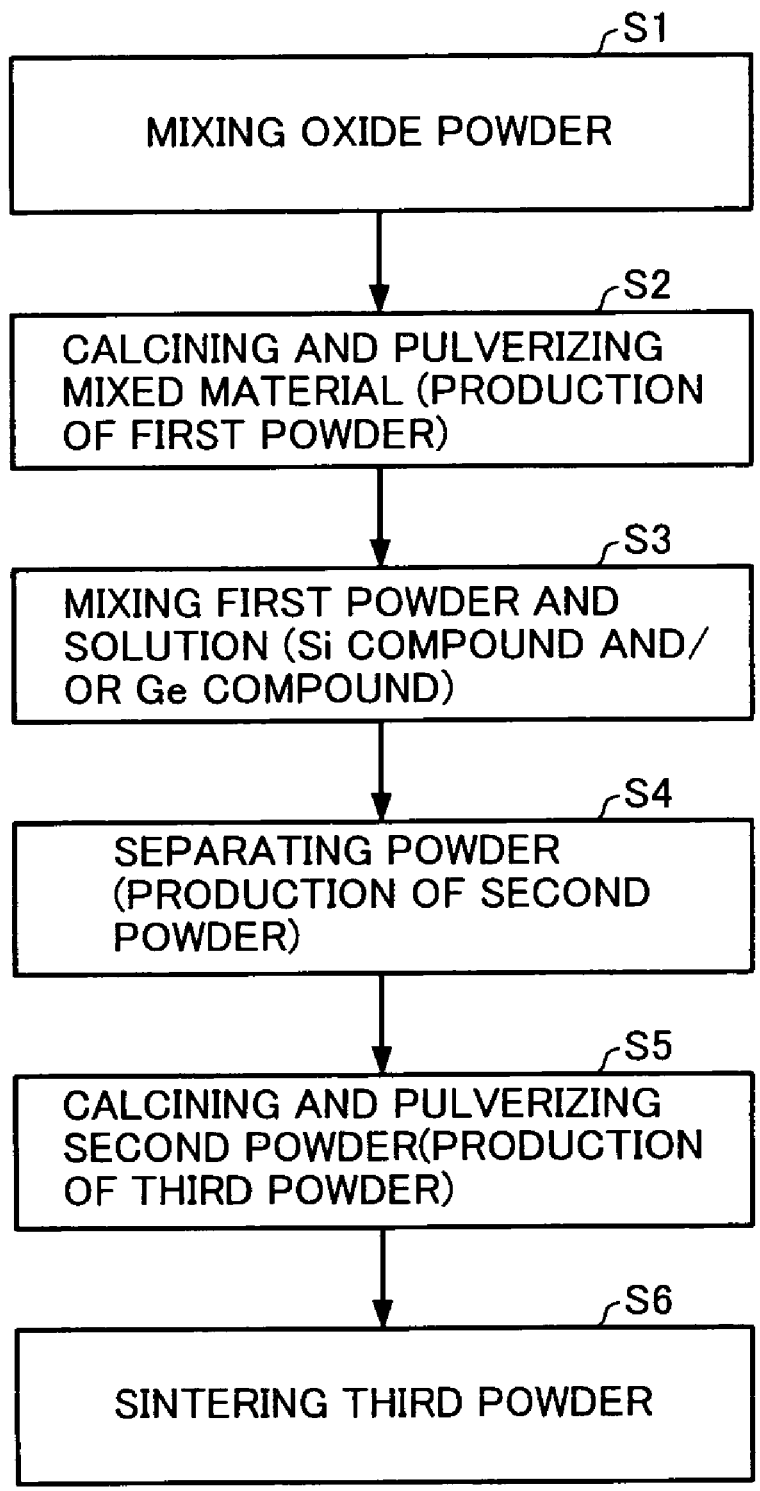
FIG. 1 is a flowchart showing a method of manufacturing an insulating target material according to one embodiment of the invention.

The invention may provide an insulating target material for obtaining a conductive complex oxide film which is uniform and exhibits excellent properties such as excellent insulating properties.

The invention may also provide a method of manufacturing the above insulating target material.

The invention may also provide a conductive complex oxide film formed by using the above insulating target material.

The invention may further provide a device including the above conductive complex oxide film.

According to one embodiment of the invention, there is provided an insulating target material for obtaining a conductive complex oxide film represented by a general formula $ABO_3$, the insulating target material comprising:
an oxide of an element A;
an oxide of an element B; and
at least one of an Si compound and a Ge compound.

The insulating target material according to this embodiment may be suitably used for RF sputtering due to uniformity and excellent insulating properties. The insulating target material according to this embodiment allows a conductive complex oxide film which exhibits excellent crystal orientation and excellent surface morphology to be obtained.

In this insulating target material, the element A may be at least one element selected from La, Ca, Sr, Mn, Ba, and Re.

In this insulating target material, the element B may be at least one element selected from Ti, V, Sr, Cr, Fe, Co, Ni, Cu, Ru, Ir, Pb, and Nd.

In this insulating target material, the Si compound and the Ge compound may be oxides.

The insulating target material may further comprise an Nb compound.

In this insulating target material, the element A may be La, and the element B may be Ni.

According to one embodiment of the invention, there is provided a method of manufacturing an insulating target material for obtaining a conductive complex oxide film represented by a general formula $ABO_3$, the method comprising:
mixing an oxide of an element A and an oxide of an element B, heat-treating the resulting mixed powder, and pulverizing the resulting product to obtain a first powder;
mixing the first powder and a solution including at least one of an Si raw material and a Ge raw material, and collecting the resulting powder to obtain a second powder;
heat-treating the second powder and pulverizing the resulting product to obtain a third powder; and
heat-treating the third powder.

The manufacturing method according to this embodiment allows an insulating target material which is uniform and exhibits excellent insulating properties to be obtained.

In this method of manufacturing an insulating target material, the solution may include at least one of the Si raw material and the Ge raw material in an amount of 2 to 10 mol %.

In this method of manufacturing an insulating target material, the mixed powder may be heat-treated at 900 to 1000° C.

In this method of manufacturing an insulating target material, the second powder may be heat-treated at 900 to 1000° C.

In this method of manufacturing an insulating target material, the third powder may be heat-treated at 1000 to 1500° C.

According to one embodiment of the invention, there is provided a conductive complex oxide film, being formed by RF sputtering method using the above-described insulating target material.

According to one embodiment of the invention, there is provided a device, comprising:
a base; and
the above-described conductive complex oxide film formed above the base.

The device according to this embodiment refers to a device including the above conductive complex oxide film, and includes a part including the conductive complex oxide film and an electronic instrument including the part. Specific examples of the device are described later.

According to one embodiment of the invention, there is provided an insulating target material, comprising:
an oxide of a first element;
an oxide of a second element; and
at least one of an Si compound and a Ge compound.

Some embodiments of the invention will be described in detail below.

1. INSULATING TARGET MATERIAL

An insulating target material according to one embodiment of the invention is an insulating target material for obtaining a conductive complex oxide film of the general formula $ABO_3$ and includes an oxide of an element A (first element), an oxide of an element B (second element), and at least one of an Si compound and a Ge compound.

Specifically, at least the element A and the element B are included in the insulating target material according to this embodiment as oxides. The element A may be at least one element selected from La, Ca, Sr, Mn, Ba, and Re. The element B may be at least one element selected from Ti, V, Sr, Cr, Fe, Co, Ni, Cu, Ru, Ir, Pb, and Nd.

A uniform insulating target material which exhibits excellent insulating properties can be obtained by incorporating at least one of the Si compound and the Ge compound into the insulating target material according to this embodiment, as is clear from the examples described later. It is preferable that the insulating target material include at least the Si compound of the Si compound and the Ge compound. It is preferable that the Si compound and the Ge compound be oxides.

In this embodiment, the insulating target material may further include an Nb compound such as an Nb oxide. An oxygen deficiency in the deposited conductive complex oxide film can be compensated for by incorporating the Nb oxide into the insulating target material.

The oxide of the element A and the oxide of the element B may be included in the insulating target material according to this embodiment at the same ratio as the stoichiometric composition of the deposited conductive complex oxide (general formula $ABO_3$), that is, at a ratio of A:B=1:1 or a ratio close to this ratio. It is preferable that the insulating target material according to this embodiment not have a perovskite structure of the general formula $ABO_3$. When the insulating target material has such a perovskite structure, the resulting target exhibits conductivity. As a result, the target may not be suitably used, or cannot be used, as a RF sputtering target.

As examples of the conductive complex oxide film to which the insulating target material according to this embodiment may be applied, $La(Sr)CoO_3$ (the metal in the parentheses indicates a substituent metal; hereinafter the same) such as $LaCoO_3$, $SrCoO_3$, and $La_{1-x}Sr_xCoO_3$ (wherein x and y represent rational numbers of 0 to 1; hereinafter the same), $La(Sr)MnO_3$ such as $LaMnO_3$, $SrMnO_3$, and $La_{1-x}Sr_xMnO_3$, $LaNiO_3$, $SrNiO_3$, $La(Sr)NiO_3$, $CaCoO_3$, $La(Sr)(Fe)CoO_3$ such as $La(Ca)CoO_3$, $LaFeO_3$, $SrFeO_3$, $La(Sr)FeO_3$, and $La_{1-x}Sr_xCo_{1-y}Fe_yO_3$, $La_{1-x}Sr_xVO_3$, $La_{1-x}Ca_xFeO_3$, $LaBaO_3$, $LaMnO_3$, $LaCuO_3$, $LaTiO_3$, $BaCeO_3$, $BaTiO_3$, $BaSnO_3$, $BaPbO_3$, $BaPb_{1-x}O_3$, $CaCrO_3$, $CaVO_3$, $CaRuO_3$, $SrIrO_3$, $SrFeO_3$, $SrVO_3$, $SrRuO_3$, $Sr(Pt)RuO_3$, $SrTiO_3$, $SrReO_3$, $SrCeO_3$, $SrCrO_3$, $BaReO_3$, $BaPb_{1-x}Bi_xO_3$, $CaTiO_3$, $CaZrO_3$, $CaRuO_3$, $CaTi_{1-x}Al_xO_3$, and the like can be given.

2. METHOD OF MANUFACTURING INSULATING TARGET MATERIAL

The insulating target material according to one embodiment of the invention may be formed using the following method. This insulating target material is a target material for obtaining a conductive complex oxide film of the general formula $ABO_3$.

The manufacturing method according to this embodiment includes mixing an oxide of an element A and an oxide of an element B, heat-treating the mixed powder, and pulverizing the resulting product to obtain a first powder, mixing the first powder and a solution including at least one of an Si raw material and a Ge raw material and collecting the resulting powder to obtain a second powder, heat-treating the second powder and pulverizing the resulting product to obtain a third powder, and heat-treating the third powder.

In more detail, the manufacturing method according to this embodiment may include the steps shown in FIG. 1.

(1) Production of First Powder

A powder of an oxide of the element A and a powder of an oxide of the element B are mixed at a composition ratio of 1:1, for example (step S1). The resulting mixed material is calcined at 900 to 1000° C. and pulverized to obtain a first powder (step S2). The resulting first powder includes the oxide of the element A and the oxide of the element B.

(2) Production of Second Powder

The first powder and a solution including at least one of an Si raw material and a Ge raw material (Si raw material and/or Ge raw material) are mixed (step S3). As the Si raw material or the Ge raw material, an alkoxide, organic acid salt, inorganic acid salt, or the like which may be used as a precursor material for a sol-gel method or an MOD method may be used. As the solution, a solution prepared by dissolving the Si raw material and/or the Ge raw material in an organic solvent such as an alcohol may be used. The Si raw material and/or the Ge raw material may be included in the solution in an amount of 2 to 10 mol % of the conductive complex oxide of the general formula $ABO_3$.

The Si raw material and the Ge raw material are preferably liquid at room temperature or soluble in the solvent. As examples of the compound which may be used, an organic salt, alkoxide, inorganic salt, and the like can be given. As specific examples of the organic salt, formate, acetate, propionate, butyrate, octylate, stearate, and the like of Si and Ge can be given. As specific examples of the alkoxide, ethoxide, propoxide, butoxide, and the like of Si and Ge can be given. The alkoxide may be a mixed alkoxide. As specific examples of the inorganic salt, hydroxide, chloride, fluoride, and the like of Si and Ge can be given. These compounds may be directly used when these compounds are liquid at room temperature, or may be used after dissolving the compound in a solvent. The Si raw material and the Ge raw material are not limited to the above compounds. A number of Si salts and Ge salts other than the above compounds may also be suitably used.

The powder and the solution are then separated by filtration or the like to obtain a second powder (step S4). The resulting second powder is obtained by mixing the first powder and the solution.

(3) Production of Third Powder

The second powder is calcined at 900 to 1000° C. and pulverized to obtain a third powder (step S5). The resulting third powder includes the oxide of the element A, the oxide of the element B, and the oxides of the Si raw material and/or the Ge raw material.

(4) Sintering

The third powder is sintered using a known method (step S6). For example, the third powder may be placed in a die and sintered by vacuum hot pressing. The third powder may be sintered at 1000 to 1500° C. The insulating target material according to this embodiment may be thus obtained.

(5) Grinding

The resulting insulating target material may be ground on the surface by wet grinding, as required.

The manufacturing method according to this embodiment allows a uniform insulating target material exhibiting excellent insulating properties to be obtained due to inclusion of the step of mixing the first powder and the solution of the Si raw material and/or the Ge raw material, as is clear from the examples described later. According to this manufacturing method, an insulating target material can be obtained which produces a conductive complex oxide film exhibiting highly controlled crystal orientation and excellent surface morphology.

3. CONDUCTIVE COMPLEX OXIDE FILM

A conductive complex oxide film of the general formula $ABO_3$ may be obtained by RF sputtering using the above insulating target material. The conductive complex oxide film includes at least one of Si and Ge, and preferably at least Si. The conductive complex oxide film of the general formula $ABO_3$ may include at least one of Si and Ge in an amount of 0.001 to 5 mol %, and preferably 0.001 to 1 mol %. Specific examples of the conductive complex oxide film of the general formula $ABO_3$ according to this embodiment have been described above. Therefore, further description is omitted.

In RF sputtering, argon and oxygen may be used as the sputtering gas. In this embodiment, an excellent conductive complex oxide film may be obtained in an atmosphere which contains only argon and does not contain oxygen.

The conductive complex oxide film according to this embodiment exhibits excellent crystal orientation and excellent surface morphology. For example, it was confirmed that a (100)-oriented $LaNiO_3$ film can be obtained by RF sputtering when using an insulating target material including oxides of La and Ni and an oxide of Si.

4. EXAMPLES

Examples according to the invention and comparative examples are described below. Note that the invention is not limited to the following examples.

4.1. Example 1 and Comparative Example 1

An insulating target according to Example 1 was formed using the following method.

A first powder was produced. In more detail, a powder of an oxide of La and a powder of an oxide of Ni were mixed at a composition ratio of 1:1. The resulting mixed material was calcined at 900 to 1000° C. and then pulverized to obtain a first powder.

A second powder was then produced. In more detail, the first powder and a silicon alkoxide solution were mixed. The silicon alkoxide solution was prepared by dissolving a silicon alkoxide in an alcohol in an amount of 5 mol %.

The powder and the solution were then separated by filtration to obtain a second powder. The resulting second powder was obtained by mixing the first powder and the solution.

The second powder was calcined at 900 to 1000° C. and then pulverized to obtain a third powder.

The third powder was sintered using a known method. In more detail, the third powder was placed in a die and sintered by vacuum hot pressing. The third powder was sintered at 1400° C. A target sample 1 of Example 1 was thus obtained.

Figure 2:
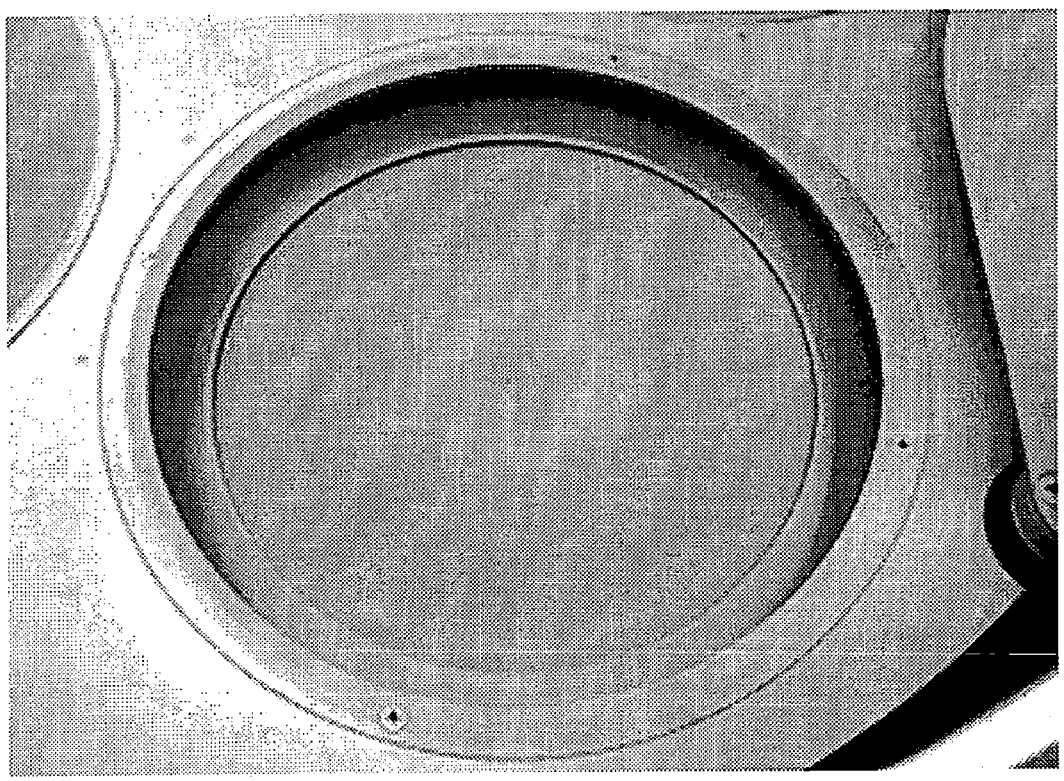
FIG. 2 is a photograph showing the outward appearance of an insulating target material of Example 1 of the invention.

FIG. 2 is a photograph of the surface of the target sample 1. As shown in FIG. 2, it was confirmed that the target of Example 1 had a uniform surface and did not contain defects such as cracks.

Figure 3:
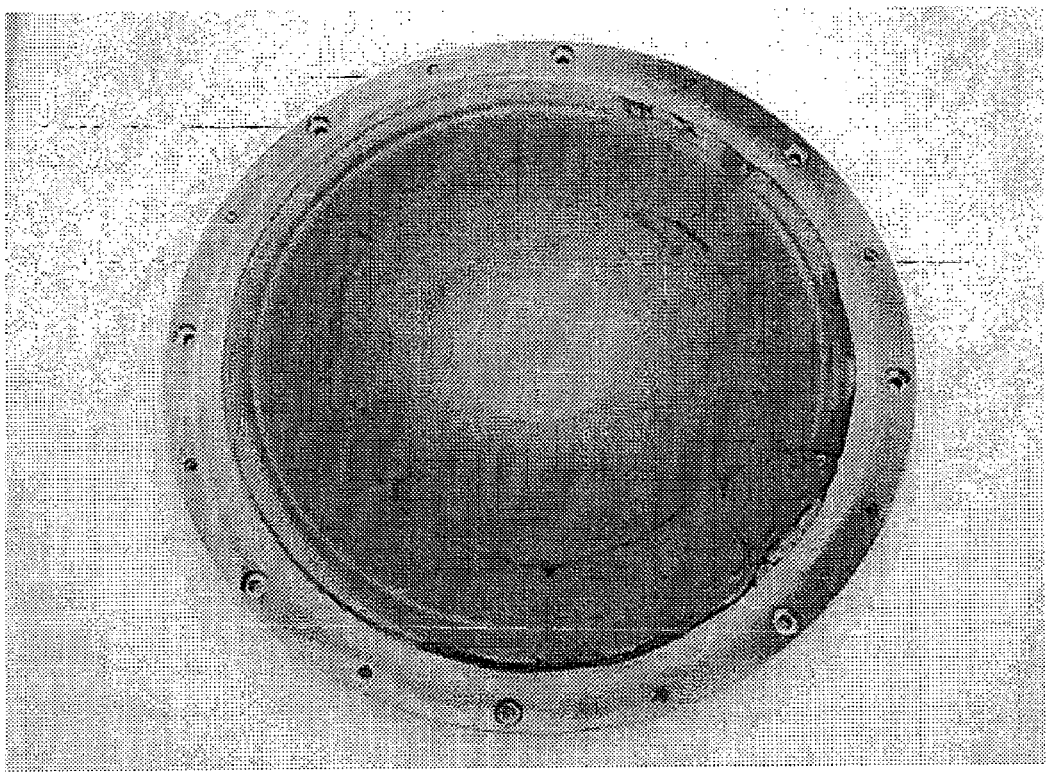
FIG. 3 is a photograph showing an insulating target material of Comparative Example 1.

Comparative Example 1 is described below. In Comparative Example 1, a target sample 2 was obtained in the same manner as in Example 1 except that the step of forming the second powder by mixing the first powder and the solution was omitted. Specifically, the target sample 2 of Comparative Example 1 was obtained by directly sintering the first powder of Example 1. The surface of the target sample 2 was observed. As a result, it was confirmed that cracks occurred in the surface of the target, as shown in FIG. 3.

4.2. Example 2 and Comparative Example 2

Figure 5:
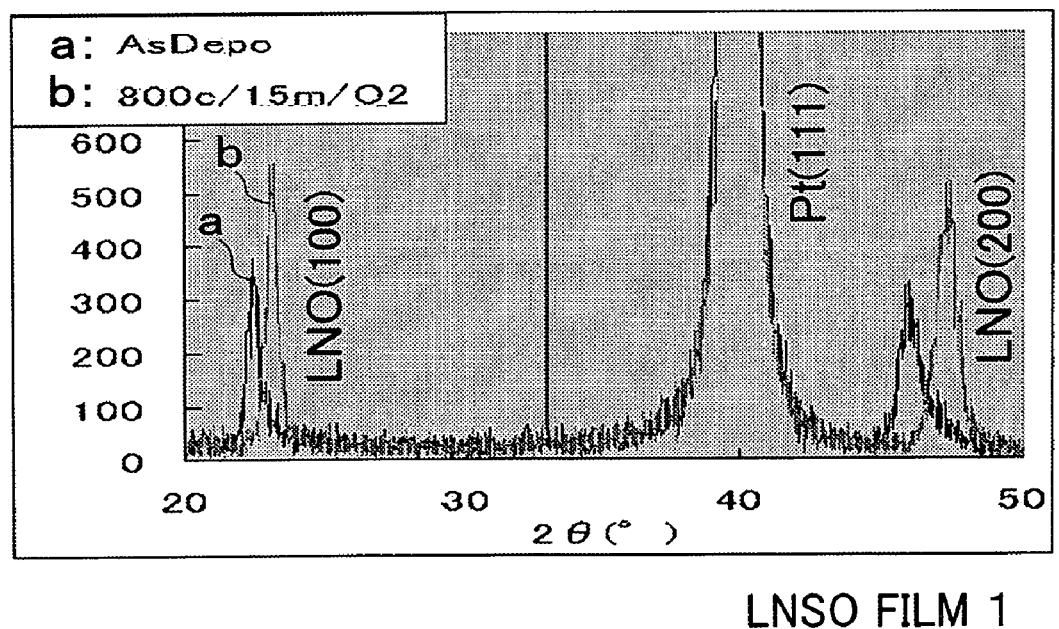
FIG. 5 is a view showing X-ray analysis results of the conductive complex oxide film of Example 2.
Figure 6:
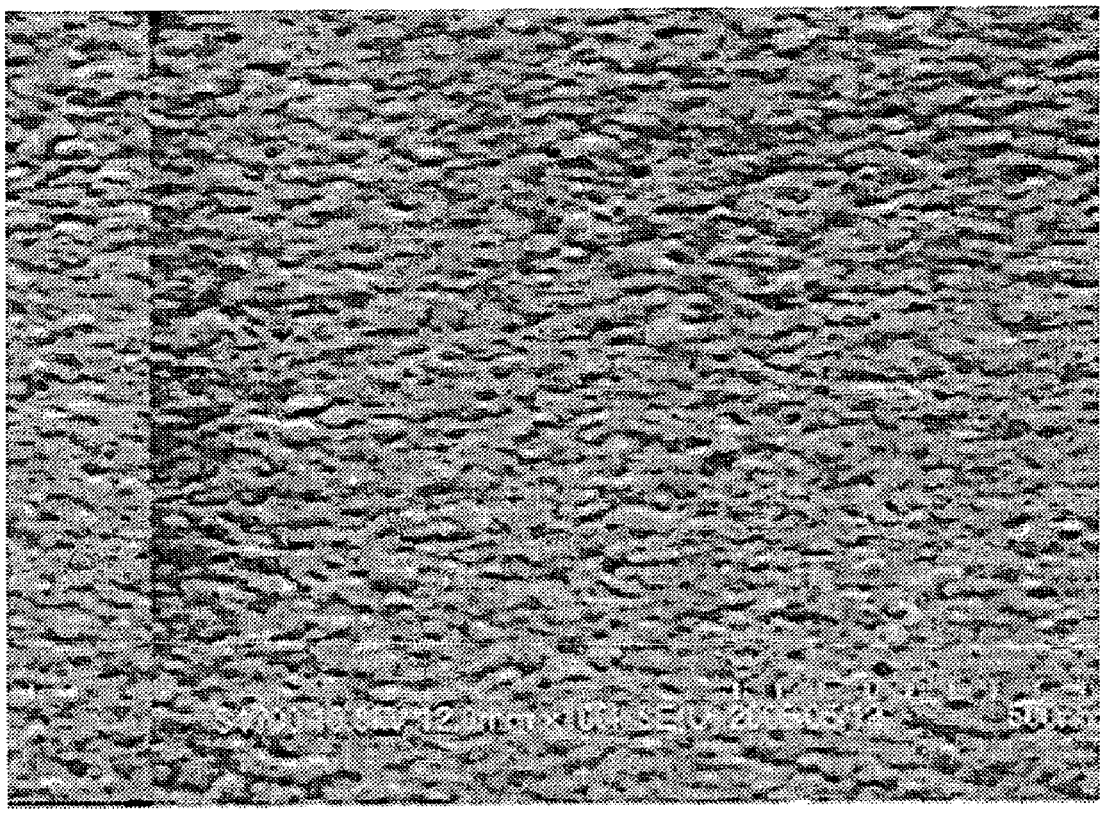
FIG. 6 is an SEM view of the conductive complex oxide film of Example 2.
Figure 7:
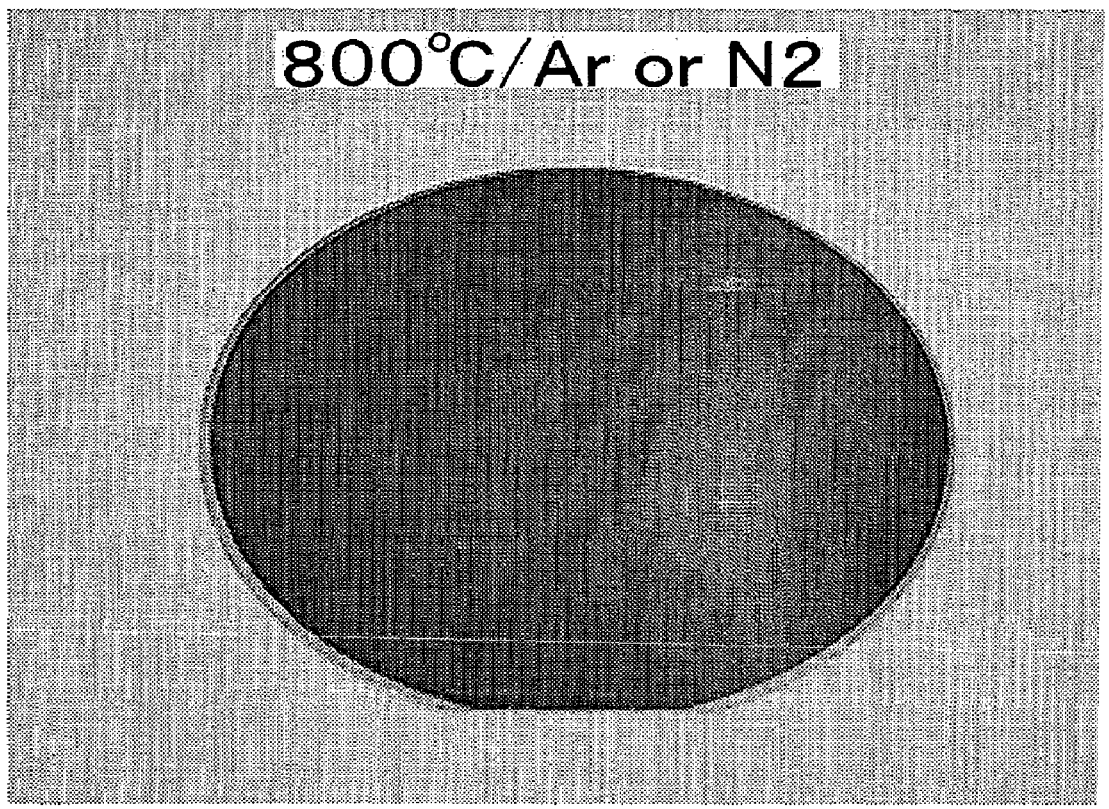
FIG. 7 is a photograph showing the outward appearance of the conductive complex oxide film of Example 2.

In Example 2, a film of a conductive complex oxide (La, Ni,Si)$O_3$ (hereinafter called "LNSO film 1") with a thickness of 80 nm was formed on a base by RF sputtering using the target sample 1 obtained in Example 1. As the base, a base formed by stacking a $ZrO_2$ film, a $TiO_x$ film, and a Pt film on a silicon substrate in that order was used. The RF sputtering was performed at a base temperature of 400° C., a power of 1400 W, a base-target distance of 70 mm, and a gas ratio of $Ar/O_2$=80/20. The LNSO film 1 was subjected to X-ray analysis, SEM observation, and outward appearance observation. The results are shown in FIG. 4. FIG. 4 shows the results for a sample (AsDepo) immediately after depositing the LNSO film 1, a sample obtained by annealing the deposited LNSO film 1 at 700 to 800° C. in an oxygen atmosphere, and a sample obtained by annealing the deposited LNSO film 1 at 700 to 800° C. in an argon or nitrogen atmosphere. FIG. 5 shows the X-ray diffraction patterns of the LNSO film 1. In FIG. 5, the pattern indicated by the symbol "a" is the pattern of the LNSO film 1 immediately after deposition, and the pattern indicated by the symbol "b" is the pattern of the LNSO film 1 annealed in an oxygen atmosphere. FIG. 6 is an SEM image of the LNSO film 1 annealed in an oxygen atmosphere, and FIG. 7 is a photograph of the outward appearance of the LNSO film 1.

The following items were confirmed from FIGS. 4 to 7.

As shown in FIG. 5, the LNSO film 1 of Example 2 was (100)-oriented. The peak was increased and 2θ was increased to some extent due to annealing. As is clear from the SEM image, it was confirmed that the AsDepo LNSO film 1 and the annealed LNSO film 1 exhibited excellent surface morphology. As is clear from the outward appearance photograph, it was confirmed that the AsDepo LNSO film 1 and the annealed LNSO film 1 had a uniform surface state.

Figure 9:
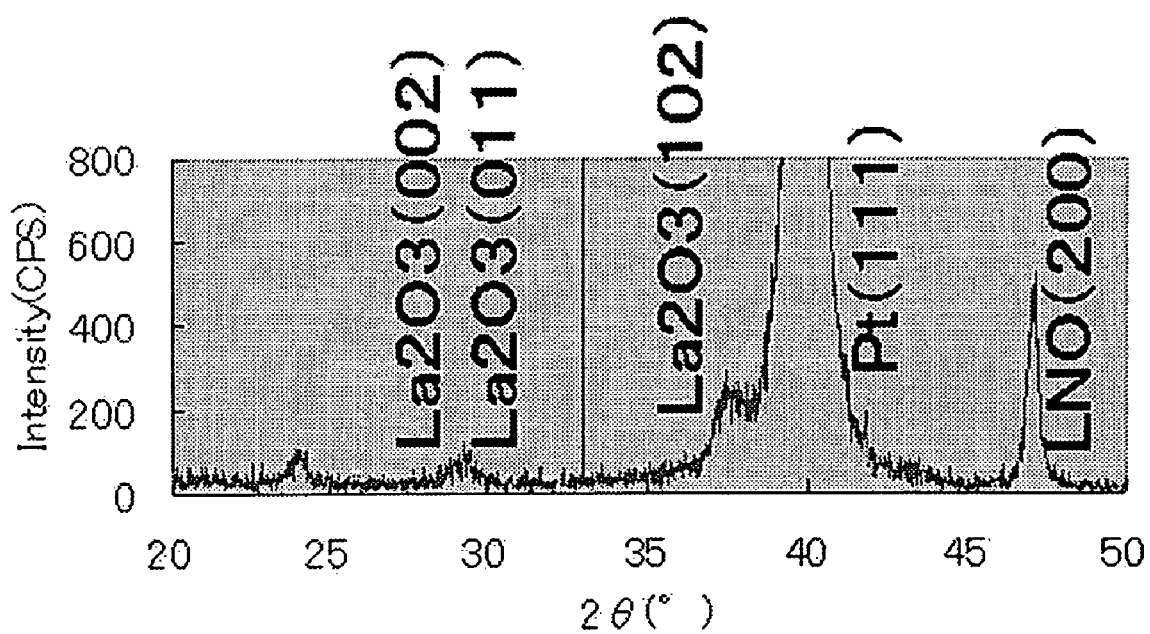
FIG. 9 is a view showing X-ray analysis results of the conductive complex oxide film of Comparative Example 2.
Figure 10:
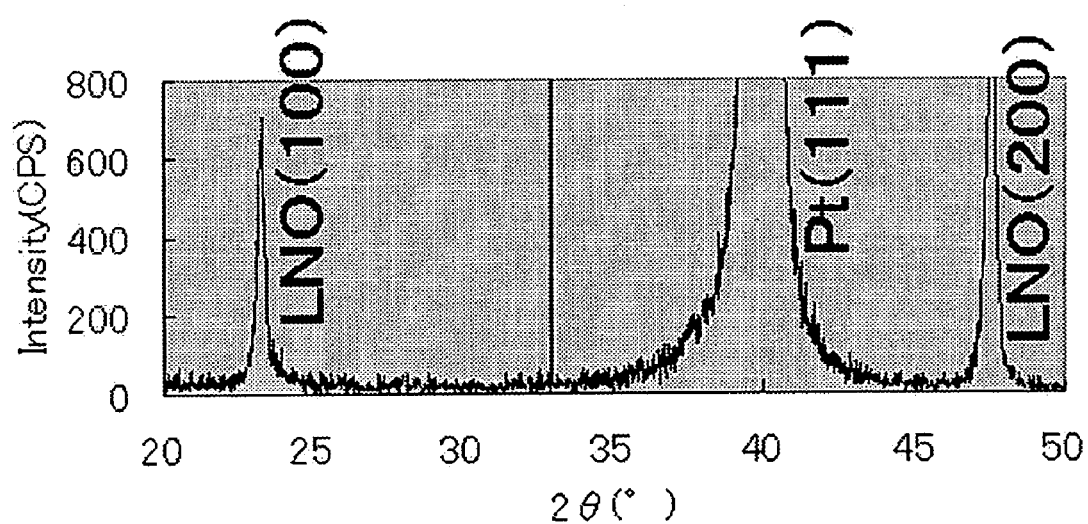
FIG. 10 is a view showing X-ray analysis results of the conductive complex oxide film of Comparative Example 2.
Figure 11:
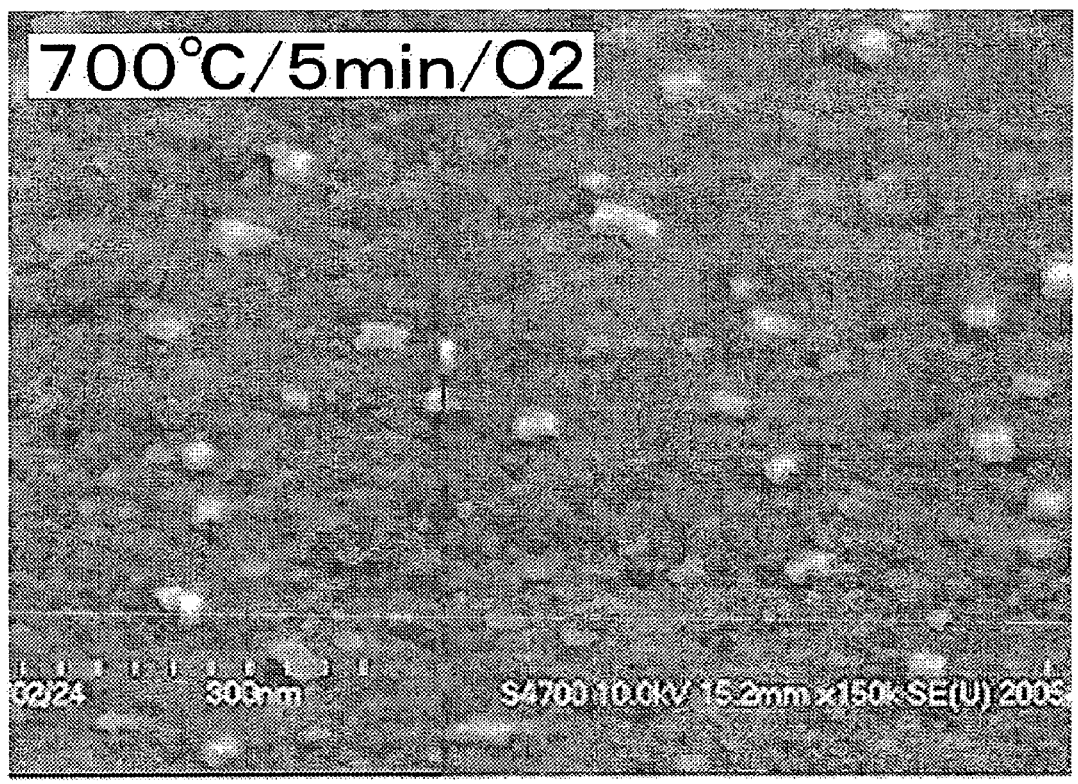
FIG. 11 is an SEM view of the conductive complex oxide film of Comparative Example 2.

In Comparative Example 2, an LNSO film 2 was obtained in the same manner as in Example 2 except for using the target sample 2 obtained in Comparative Example 1. The LNSO film 2 was subjected to X-ray analysis, SEM observation, and outward appearance observation in the same manner as in Example 2. The results are shown in FIG. 8. FIG. 8 shows the results for a sample (AsDepo) immediately after depositing the LNSO film 2, a sample obtained by annealing the deposited LNSO film 2 at 700 to 800° C. in an oxygen atmosphere, and a sample obtained by annealing the deposited LNSO film 2 at 700 to 800° C. in an argon or nitrogen atmosphere. FIGS. 9 and 10 show the X-ray diffraction patterns of the LNSO film 2. FIG. 9 is the pattern of part of the annealed LNSO film 2, and FIG. 10 is the pattern of another part of the LNSO film 2. FIG. 11 is an SEM image of the LNSO film 2 annealed in an oxygen atmosphere, and FIG. 12 is a photograph of the outward appearance of the LNSO film 2.

Figure 12:
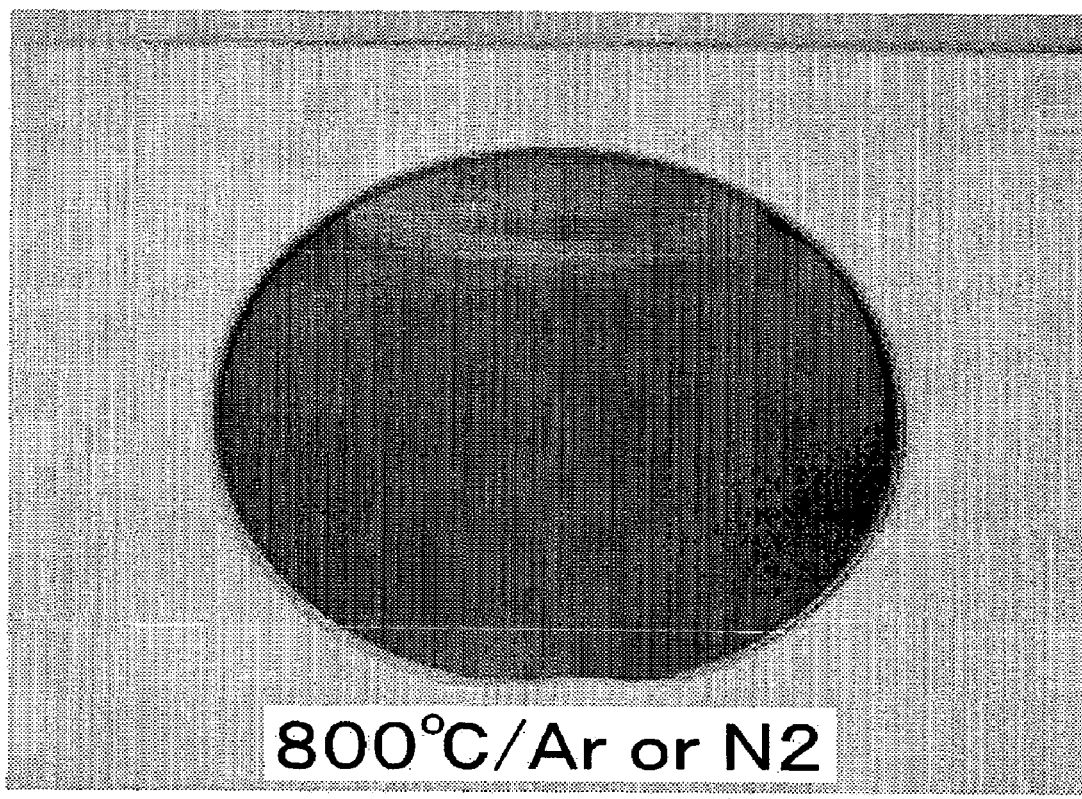
FIG. 12 is a photograph showing the outward appearance of the conductive complex oxide film of the comparative example.

The following items were confirmed from FIGS. 8 to 12. As shown in FIG. 12, it was confirmed that the LNSO film 2 of Comparative Example 2 had a nonuniform surface outward appearance, in which the color of the surface differs between the upper portion and the lower portion of the photograph. FIG. 9 shows the X-ray pattern of the LNSO film 2 in the upper portion of the outward appearance photograph, and FIG. 10 shows the X-ray pattern of the LNSO film 2 in the lower portion of the outward appearance photograph. As shown in FIGS. 9 and 10, it was confirmed that the LNSO film 2 was (100)-oriented in the lower portion of the outward appearance photograph, and that the LNSO film 2 was (100)-oriented to only a small extent in the upper portion of the outward appearance photograph. Specifically, it was confirmed that the LNSO film 2 of Comparative Example 2 exhibited nonuniform crystallinity. As is clear from the SEM image, it was confirmed that the annealed LNSO films 2 exhibited poor surface morphology.

4.3. Example 3 and Comparative Example 3

Figure 14:
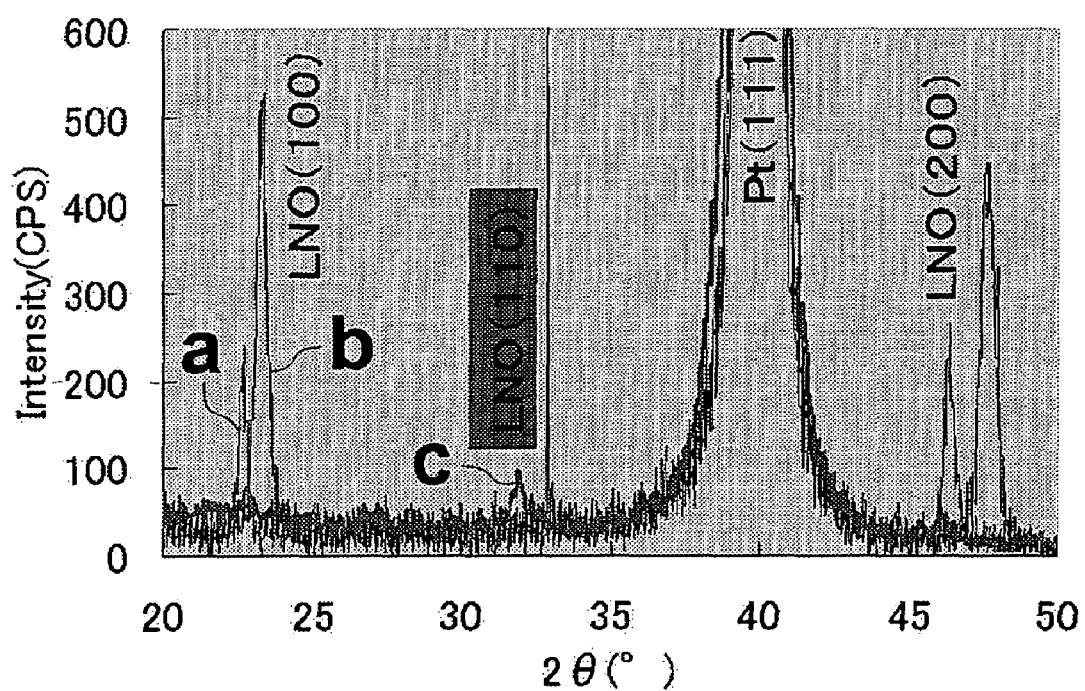
FIG. 14 is a view showing X-ray analysis results of the conductive complex oxide films of Example 3 and Comparative Example 4.

In Example 3, an LNSO film 3 with a thickness of 80 nm was formed on a base in the same manner as in Example 2 except for changing the gas ratio during RF sputtering to $Ar/O_2$=100/0 (atmosphere containing only argon). The LNSO film 3 was subjected to X-ray analysis and SEM observation. The results are shown in FIG. 13. FIG. 13 shows the results for a sample (AsDepo) immediately after depositing the LNSO film 3, a sample obtained by annealing the deposited LNSO film 3 at 700 to 800° C. in an oxygen atmosphere, and a sample obtained by annealing the deposited LNSO film 3 at 700 to 800° C. in an argon or nitrogen atmosphere. FIG. 14 shows the X-ray diffraction patterns of the LNSO film 3. In FIG. 14, the pattern indicated by the symbol "a" is the pattern of the LNSO film 3 immediately after deposition, and the pattern indicated by the symbol "b" is the pattern of the LNSO film 3 annealed in an oxygen atmosphere.

The following items were confirmed from FIGS. 13 and 14.

The LNSO film 3 of Example 3 was (100)-oriented. The peak was increased and 2θ was increased to some extent due to annealing. As is clear from the SEM image, it was confirmed that the AsDepo LNSO film 3 and the annealed LNSO film 3 exhibited excellent surface morphology.

In Comparative Example 3, an LNSO film 4 was obtained in the same manner as in Example 3 except for using the target sample 2 obtained in Comparative Example 1. The LNSO film 4 was subjected to X-ray analysis and SEM observation in the same manner as in Example 3. FIG. 14 shows the X-ray diffraction pattern (symbol "c") of the LNSO film 4 of Comparative Example 3. As shown in FIG. 14, the LNSO film 4 was (100)-oriented to only a small extent, and was (100)-oriented to a small extent.

From the above results, it was confirmed that an insulating LNSO target material which does not contain cracks or the like and exhibits excellent uniformity can be obtained according to the examples of the invention. It was also confirmed that the conductive LNSO film deposited using the insulating LNSO target material exhibited excellent properties including excellent crystal orientation, surface morphology, and uniformity. It was also confirmed that an excellent conductive LNSO film can be obtained using the insulating LNSO target material according to the examples even in an argon atmosphere which does not contain oxygen.

5. DEVICE

A device according to one embodiment of the invention includes a base and the conductive complex oxide film according to the invention formed above the base. The device according to one embodiment of the invention includes a part including the conductive complex oxide film according to the invention and an electronic instrument including the part. Examples of the device according to the invention are described below.

5.1. Semiconductor Device

A semiconductor device including the conductive complex oxide film according to the invention is described below. This embodiment illustrates an example of a ferroelectric memory device including a ferroelectric capacitor which is an example of the semiconductor device.

Figure 15A:
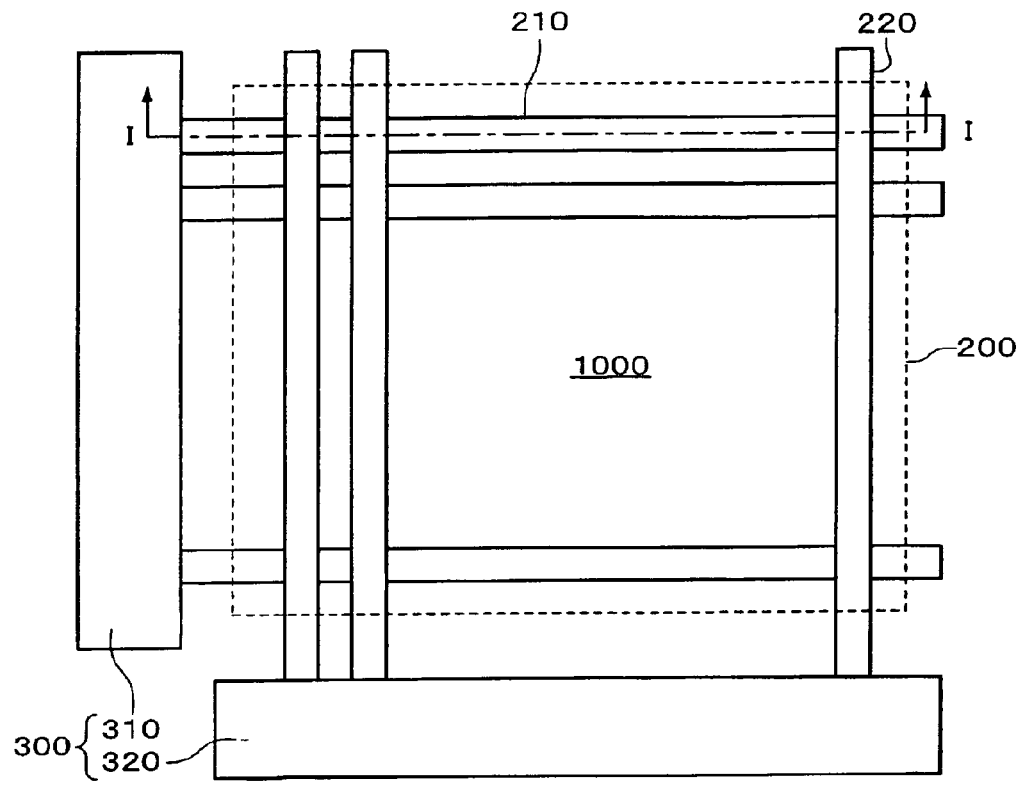
FIGS. 15A and 15B are views showing a semiconductor device according to one embodiment of the invention.
Figure 15B:
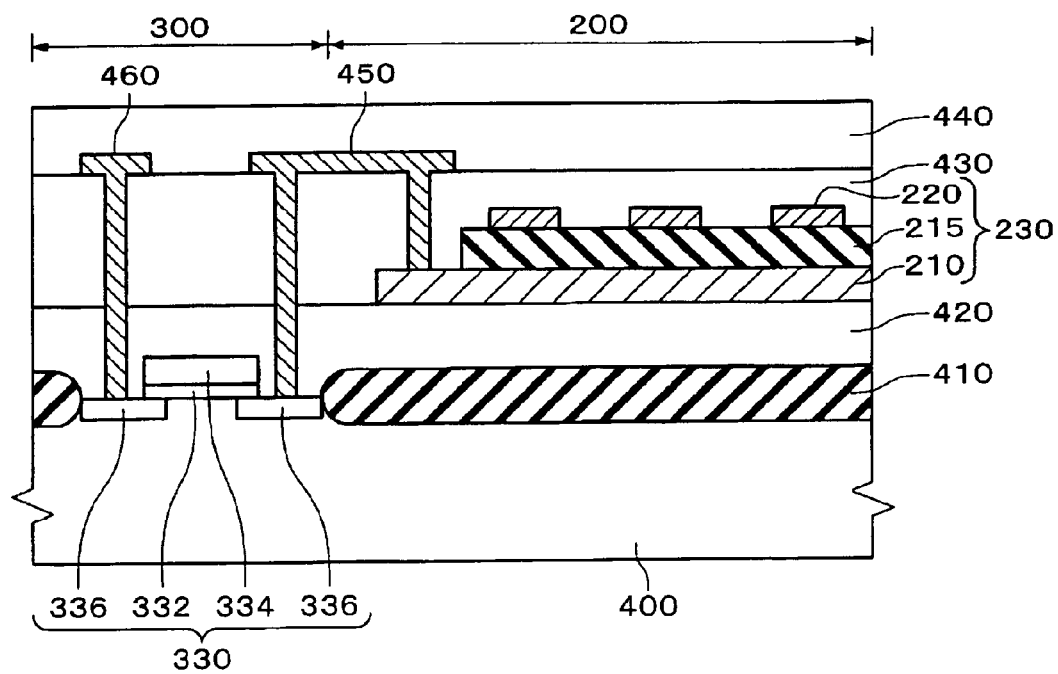

FIGS. 15A and 15B are views schematically showing a ferroelectric memory device 1000 in which the conductive complex oxide film according to the invention is used as an electrode. FIG. 15A shows the planar shape of the ferroelectric memory device 1000, and FIG. 15B shows the cross section along the line I-I in FIG. 15A. As shown in FIG. 15A, the ferroelectric memory device 1000 includes a memory cell array 200 and a peripheral circuit section 300. The memory cell array 200 and the peripheral circuit section 300 are formed in different layers. The peripheral circuit section 300 is disposed on a semiconductor substrate 400 in a region differing from the memory cell array 200. As specific examples of the peripheral circuit section 300, a Y gate, sense amplifier, input/output buffer, X address decoder, Y address decoder, or address buffer can be given.

In the memory cell array 200, row-select lower electrodes 210 (wordlines) and column-select upper electrodes 220 (bit-lines) are arranged to intersect. The lower electrodes 210 and the upper electrodes 220 are formed in the shape of stripes formed of linear signal electrodes. The signal electrodes may be formed so that the lower electrode 210 serves as the bitline and the upper electrode 220 serves as the wordline.

As shown in FIG. 15B, a ferroelectric film 215 is disposed between the lower electrodes 210 and the upper electrodes 220. In the memory cell array 200, a memory cell which functions as a ferroelectric capacitor 230 is formed in the region in which the lower electrode 210 and the upper electrode 220 intersect. At least either the lower electrode 210 or the upper electrode 220 is a film formed using the conductive complex oxide film according to the invention. The lower electrode 210 and the upper electrode 220 may be single layers of the conductive complex oxide film according to the invention, or may have a stacked structure including the conductive complex oxide film according to the invention and another conductive film. A known barrier film may be formed between a first interlayer dielectric 420 and the lower electrode 210. The ferroelectric film 215 may be disposed between the lower electrode 210 and the upper electrode 220 at least in the region in which the lower electrode 210 and the upper electrode 220 intersect.

In the ferroelectric memory device 1000, a second interlayer dielectric 430 is formed to cover the lower electrode 210, the ferroelectric film 215, and the upper electrode 220. An insulating protective layer 440 is formed on the second interlayer dielectric 430 so that interconnect layers 450 and 460 are covered with the protective layer 440.

As shown in FIG. 15A, the peripheral circuit section 300 includes various circuits for selectively writing or reading information into or from the memory cell array 200. For example, the peripheral circuit section 300 includes a first driver circuit 310 for selectively controlling the lower electrode 210, a second driver circuit 320 for selectively controlling the upper electrode 220, and a signal detection circuit (not shown) such as a sense amplifier.

As shown in FIG. 15B, the peripheral circuit section 300 includes a MOS transistor 330 formed on the semiconductor substrate 400. The MOS transistor 330 includes a gate insulating film 332, a gate electrode 334, and source/drain regions 336. The MOS transistors 330 are isolated by an element isolation region 410. The first interlayer dielectric 420 is formed on the semiconductor substrate 400 on which the MOS transistor 330 is formed. The peripheral circuit section 300 is electrically connected with the memory cell array 200 through an interconnect layer 51. An example of write and read operations of the ferroelectric memory device 1000 is described below.

In the read operation, a read voltage is applied to the capacitor in the selected memory cell. This also serves as the write operation of "0". At this time, a current flowing through the selected bitline or a potential when causing the bitline to be in a high impedance state is read by using a sense amplifier. A specific voltage is applied to the capacitors of the unselected memory cells in order to prevent occurrence of crosstalk during reading.

In the write operation of "1", a write voltage which causes a polarization reversal is applied to the capacitor in the selected memory cell. In the write operation of "0", a write voltage which does not cause a polarization reversal is applied to the capacitor in the selected memory cell to hold the "0" state written during the read operation. A specific voltage is applied to the capacitors in the unselected memory cells in order to prevent occurrence of crosstalk during writing.

In the ferroelectric memory device 1000, the ferroelectric capacitor 230 includes the ferroelectric film 215 which can be crystallized at a low temperature. Therefore, the ferroelectric memory device 1000 can be manufactured without causing deterioration of the MOS transistor 330 making up the peripheral circuit section 300 and the like. Since the ferroelectric capacitor 230 has excellent hysteresis characteristics, a highly reliable ferroelectric memory device 1000 can be provided.

Figure 16:
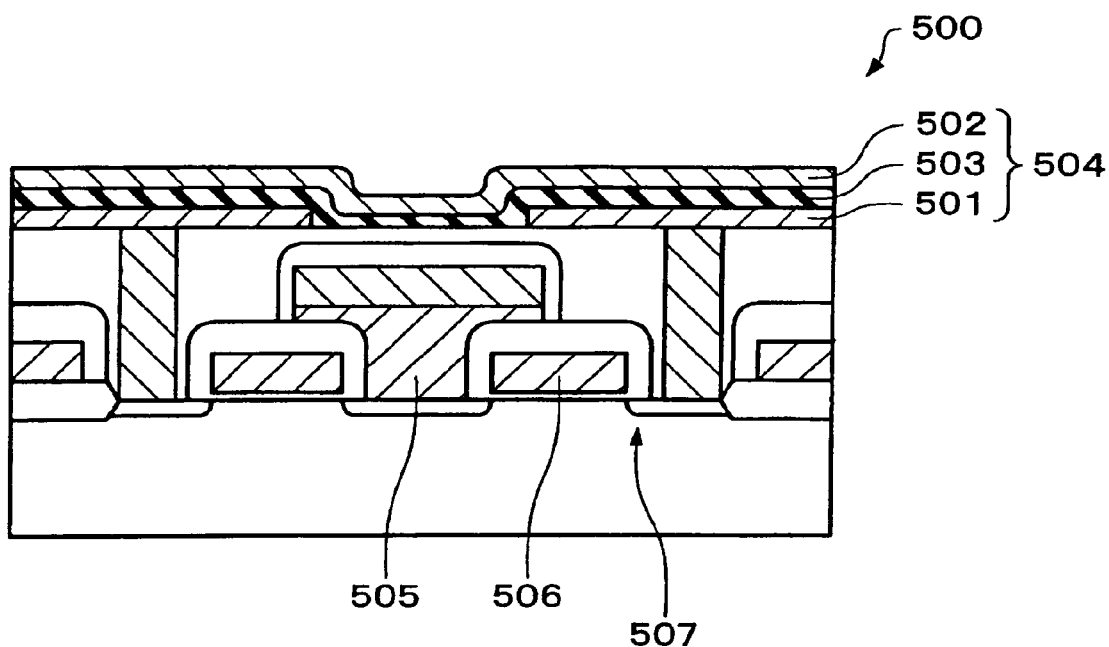
FIG. 16 is a cross-sectional view schematically showing a 1T1C ferroelectric memory according to one embodiment of the invention.
Figure 17:
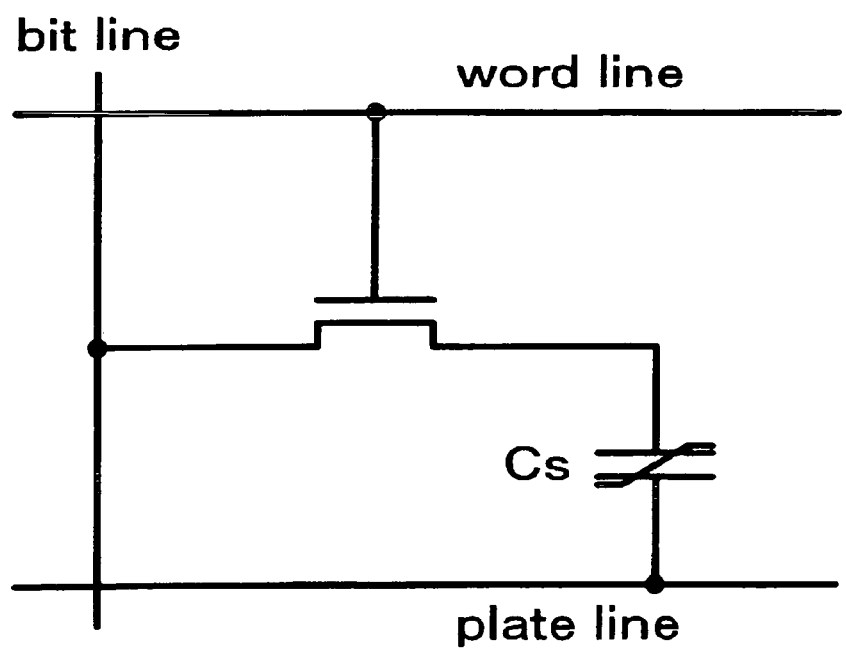
FIG. 17 is a view showing an equivalent circuit of the ferroelectric memory shown in FIG. 16.

FIG. 16 is a structural diagram of a 1T1C ferroelectric memory device 500 as another example of the semiconductor device. FIG. 17 is an equivalent circuit diagram of the ferroelectric memory device 500.

As shown in FIG. 16, the ferroelectric memory device 500 is a memory device having a structure similar to that of a DRAM, and includes a capacitor 504 (1C) including a lower electrode 501, an upper electrode 502 connected with a plate line, and a ferroelectric film 503 according to the above-described embodiment, and a switch transistor element 507 (1T) including source/drain electrodes, one of which is connected with a data line 505, and a gate electrode 506 connected with a wordline. In this example, at least either the lower electrode 501 or the upper electrode 502 is a film formed using the conductive complex oxide film according to the invention in the same manner as in the example shown in FIGS. 15A and 15B. In the 1T1C memory, data can be written and read at a speed as high as 100 ns or less, and the written data does not volatilize. Therefore, the ITIC memory is a promising memory which may replace an SRAM or the like.

The semiconductor device according to this embodiment is not limited to the above-described semiconductor devices. The semiconductor device according to this embodiment may also be applied to a 2T2C ferroelectric memory device and the like.

5.2. Piezoelectric Device

An example in which the conductive complex oxide film according to the invention is applied to a piezoelectric device is described below.

Figure 18:
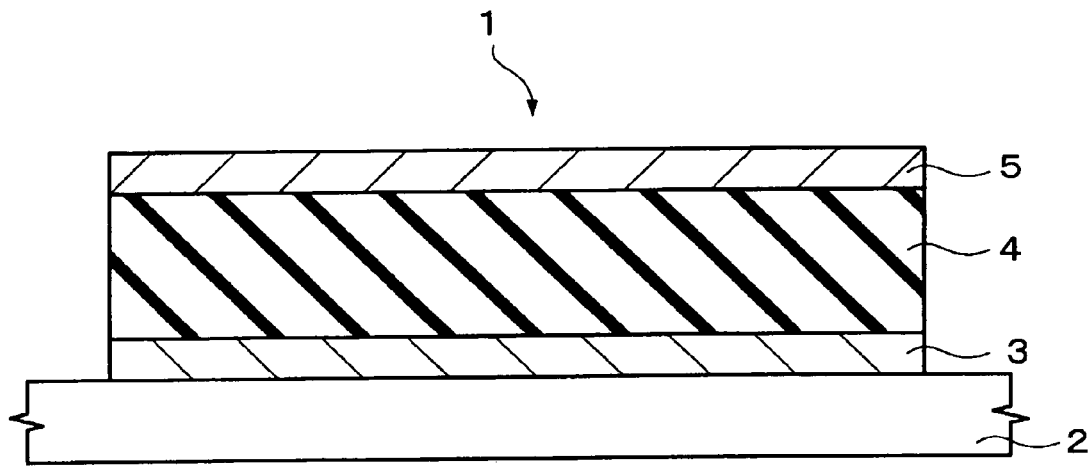
FIG. 18 is a cross-sectional view schematically showing a piezoelectric device according to an application example of one embodiment of the invention.

FIG. 18 is a cross-sectional view showing a piezoelectric device 1 including the conductive complex oxide film according to the invention. The piezoelectric device 1 includes a substrate 2, a lower electrode 3 formed on the substrate 2, a piezoelectric film 4 formed on the lower electrode 3, and an upper electrode 5 formed on the piezoelectric film 4. At least either the lower electrode 3 or the upper electrode 5 is a film formed using the conductive complex oxide film according to the invention. The lower electrode 3 and the upper electrode 5 may be single layers of the conductive complex oxide film according to the invention, or may have a stacked structure including the conductive complex oxide film according to the invention and another conductive film. As the substrate 2, a silicon substrate may be used. In this embodiment, a (110)-oriented single crystal silicon substrate is used as the substrate 2. A (100)-oriented single crystal silicon substrate or a (111)-oriented single crystal silicon substrate may also be used as the substrate 2. In addition, a substrate obtained by forming an amorphous silicon oxide film such as a thermal oxide film or a natural oxide film on the surface of a silicon substrate may also be used as the substrate 2. The substrate 2 is processed so that ink cavities 521 are formed in an inkjet recording head 50 as described later (see FIG. 19).

The lower electrode 3 is an electrode for applying a voltage to the piezoelectric film 4. The lower electrode 3 may be formed to have the same planar shape as the piezoelectric film 4, for example. When two or more piezoelectric devices 1 are formed in the inkjet recording head 50 described later (see FIG. 19), the lower electrode 3 may be formed to function as a common electrode for the piezoelectric devices 1. The lower electrode 3 is formed to have a thickness of about 100 to 200 nm, for example.

5.3. Inkjet Recording Head

Figure 19:
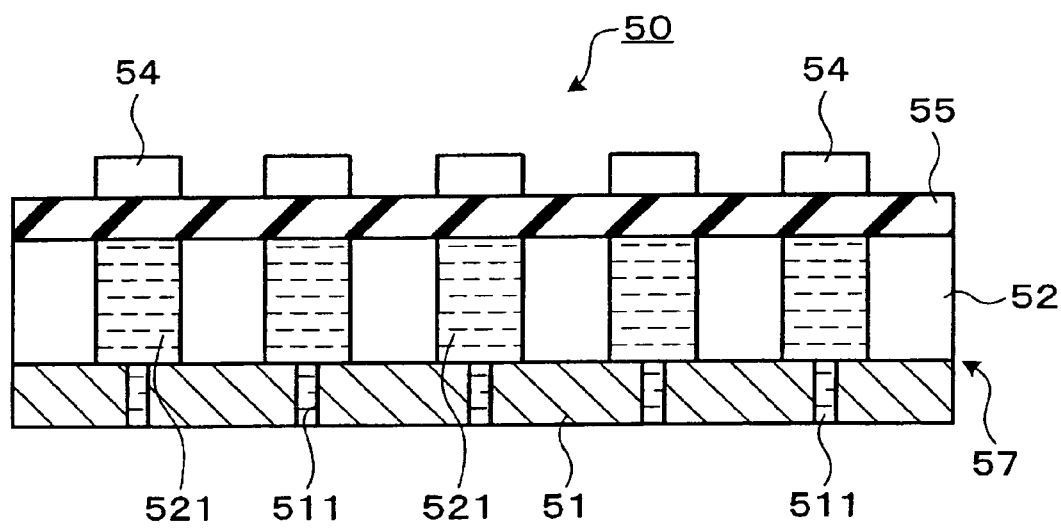
FIG. 19 is a schematic configuration view of an inkjet recording head according to an application example of one embodiment of the invention.
Figure 20:
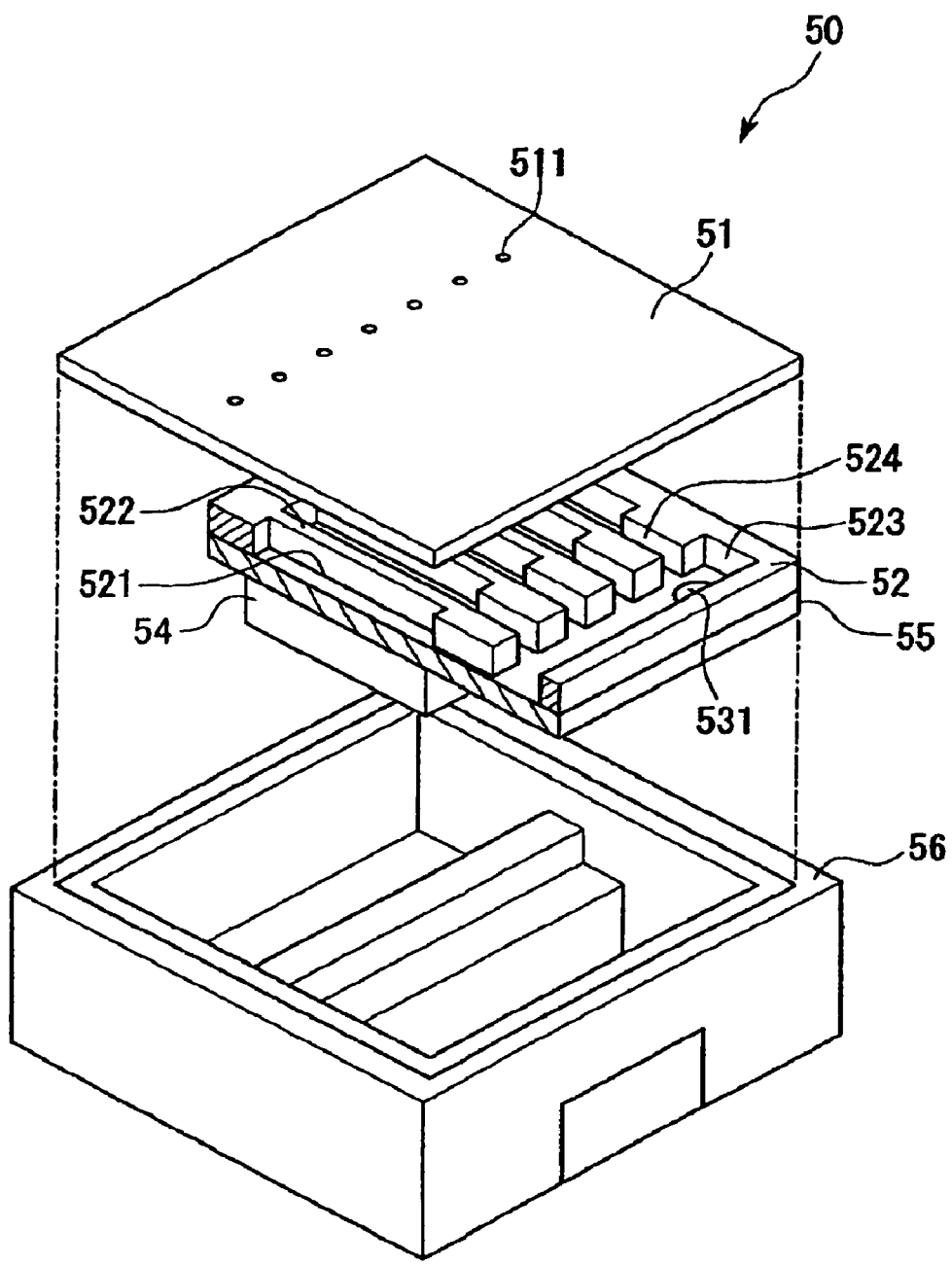
FIG. 20 is an exploded perspective view of an inkjet recording head according to an application example of one embodiment of the invention.
Figure 21:
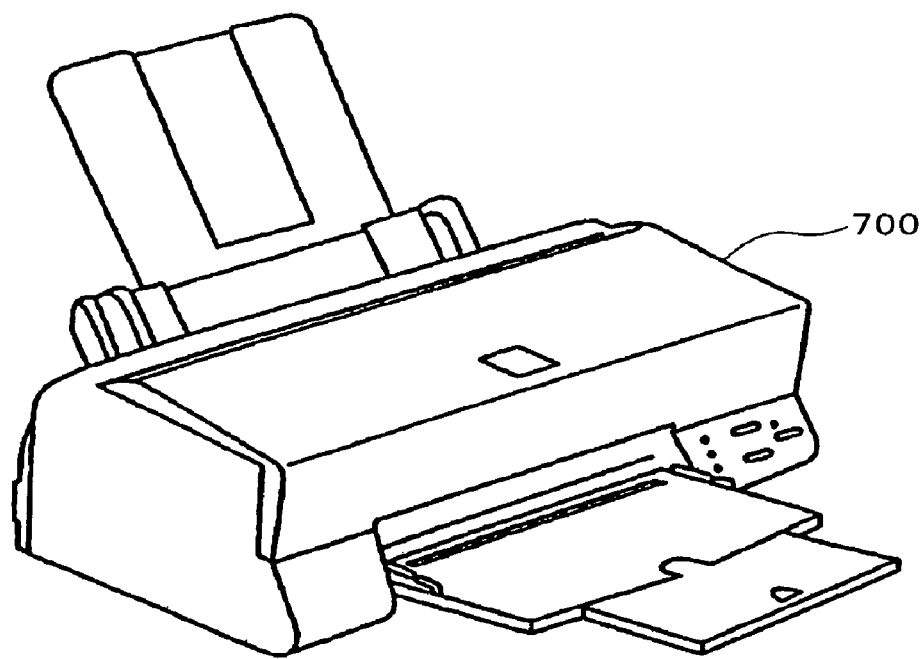
FIG. 21 is a schematic configuration view of an inkjet printer according to an application example of one embodiment of the invention.

An inkjet recording head in which the above-described piezoelectric device functions as a piezoelectric actuator, and an inkjet printer including the inkjet recording head are described below. FIG. 19 is a side cross-sectional view showing a schematic configuration of the inkjet recording head according to this embodiment, and FIG. 20 is an exploded perspective view of the inkjet recording head which is illustrated in a vertically reversed state. FIG. 21 shows an inkjet printer 700 including the inkjet recording head according to this embodiment.

As shown in FIG. 19, the inkjet recording head 50 includes a head body (base) 57 and a piezoelectric section 54 formed over the head body 57. The piezoelectric device 1 shown in FIG. 18 is provided in the piezoelectric section 54. The piezoelectric device 1 is formed by stacking the lower electrode 3, the piezoelectric film (ferroelectric film) 4, and the upper electrode 5 in that order. In the inkjet recording head, the piezoelectric section 54 functions as a piezoelectric actuator.

The inkjet recording head 50 includes a nozzle plate 51, an ink chamber substrate 52, an elastic film 55, and the piezoelectric section 54 bonded to the elastic film 55. These components are accommodated in a housing 56. The inkjet recording head 50 forms an on-demand type piezo jet head.

The nozzle plate 51 is formed of a stainless steel rolled plate or the like, in which a number of nozzles 511 for discharging ink droplets are formed in a row. The pitch between the nozzles 511 is appropriately determined depending on the printing precision.

The ink chamber substrate 52 is attached to (secured on) the nozzle plate 51. In the ink chamber substrate 52, cavities (ink cavities) 521, a reservoir 523, and supply ports 524 are partitioned by the nozzle plate 51, a side wall (partition wall) 522, and the elastic film 55. The reservoir 523 temporarily stores ink supplied from an ink cartridge (not shown). The ink is supplied to each cavity 521 from the reservoir 523 through the supply ports 524.

As shown in FIGS. 19 and 20, the cavity 521 is disposed corresponding to the nozzle 511. The volume of the cavity 521 can be changed by vibration of the elastic film 55. The cavity 521 is configured to discharge the ink as a result of a change in volume.

A (110)-oriented single crystal silicon substrate is used as the base material for the ink chamber substrate 52. Since the (110)-oriented single crystal silicon substrate is suitable for anisotropic etching, the ink chamber substrate 52 can be easily and reliably formed. The single crystal silicon substrate is used so that the surface on which the elastic film 55 is formed is the (110) plane.

The elastic film 55 is disposed on the ink chamber substrate 52 on the side opposite to the nozzle plate 51. The piezoelectric sections 54 are disposed on the elastic film 55 on the side opposite to the ink chamber substrate 52. As shown in FIG. 20, a communication hole 531 is formed through the elastic film 55 in the thickness direction at a specific position of the elastic film 55. The ink is supplied to the reservoir 523 from the ink cartridge through the communication hole 531.

The piezoelectric section is electrically connected with a piezoelectric device driver circuit (not shown) and is actuated (vibrate or deformed) based on a signal from the piezoelectric device driver circuit. Specifically, the piezoelectric section 54 functions as a vibration source (head actuator). The elastic film 55 vibrates due to vibration (deflection) of the piezoelectric section 54, and functions to momentarily increase the pressure inside the cavity 521.

An example of the inkjet recording head which discharges ink is described above. However, this embodiment aims at a liquid jet head using a piezoelectric device and a liquid jet device in general. As the liquid jet head, a recording head used for an image recording device such as a printer, a color material jet head used to manufacture a color filter for a liquid crystal display or the like, an electrode material jet head used to form an electrode of an organic EL display, a field emission display (FED), or the like, a bio-organic substance jet head used to manufacture a bio-chip, and the like can be given.

5.4. Surface Acoustic Wave Device

Figure 22:
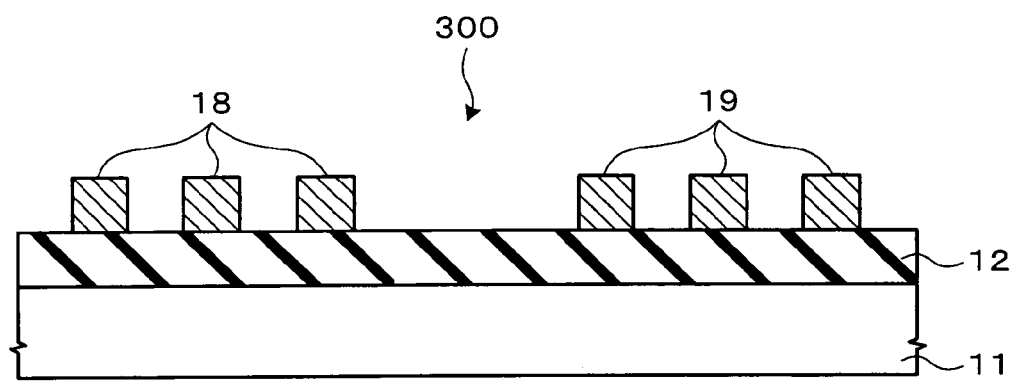
FIG. 22 is a cross-sectional view showing a surface acoustic wave device according to an application example of one embodiment of the invention.

An example of a surface acoustic wave device to which the conductive complex oxide film according to the invention is applied is described below with reference to the drawings. FIG. 22 is a cross-sectional view schematically showing a surface acoustic wave device 300 according to this embodiment.

The surface acoustic wave device 300 includes a substrate 11, a piezoelectric film 12 formed on the substrate 11, and interdigital transducers (hereinafter called "IDT electrodes") 18 and 19 formed on the piezoelectric film 12. The IDT electrodes 18 and 19 have a specific pattern. The IDT electrodes 18 and 19 are formed using the conductive complex oxide film according to the invention.

The surface acoustic wave device 300 according to this embodiment is formed as described below using the conductive complex oxide film according to the invention, for example.

The conductive complex oxide film according to the invention is formed on the piezoelectric film 12 shown in FIG. 22 by RF sputtering using the insulating target material according to the invention. The IDT electrodes 18 and 19 are formed on the piezoelectric film 12 by patterning the conductive complex oxide film using a known lithography technology and etching technology.

5.5 Frequency Filter

Figure 23:
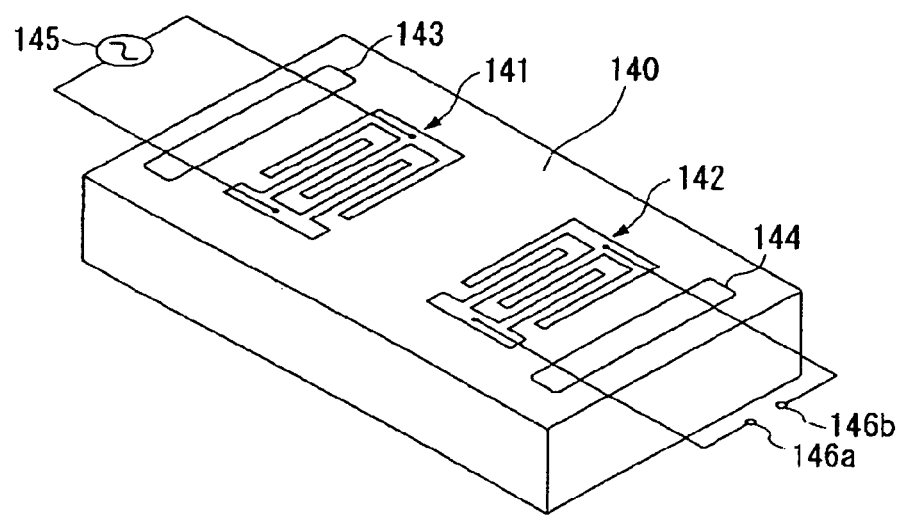
FIG. 23 is a perspective view showing a frequency filter according to an application example of one embodiment of the invention.

An example of a frequency filter to which the conductive complex oxide film according to the invention is applied is described below with reference to the drawings. FIG. 23 is a view schematically showing the frequency filter according to this embodiment.

As shown in FIG. 23, the frequency filter includes a base 140. As the base 140, a laminate similar to that of the above-described surface acoustic wave device 300 may be used (see FIG. 22).

IDT electrodes 141 and 142 are formed on the upper side of the base 140. Sound absorbing sections 143 and 144 are formed on the upper side of the base 140 so that the IDT electrodes 141 and 142 are positioned between the sound absorbing sections 143 and 144. The sound absorbing sections 143 and 144 absorb surface acoustic waves propagated on the surface of the base 140. A high-frequency signal source 145 is connected with the IDT electrode 141, and signal lines are connected with the IDT electrode 142. The IDT electrodes 141 and 142 may be formed using the conductive complex oxide film according to the invention.

The operation of the frequency filter is described below.

In the above-described configuration, when a high-frequency signal is output from the high-frequency signal source 145, the high-frequency signal is applied to the IDT electrode 141, whereby surface acoustic waves occur on the upper side of the base 140. The surface acoustic waves propagated from the IDT electrode 141 toward the sound absorbing section 143 are absorbed by the sound absorbing section 143. However, the surface acoustic waves propagated toward the IDT electrode 142 and having a specific frequency determined by the pitch of the IDT electrode 142 or the like or having a frequency in a specific band are converted into electric signals, and supplied to terminals 146a and 146b through the signal lines. Most of the frequency components other than the specific frequency or the frequency in the specific band are absorbed by the sound absorbing section 144 through the IDT electrode 142. Therefore, it is possible to obtain (filter) only surface acoustic waves having the specific frequency or the frequency in the specific band from the electric signals supplied to the IDT electrode 141 of the frequency filter according to this embodiment.

5.6. Oscillator

An example of an oscillator to which the conductive complex oxide film according to the invention is applied is described below with reference to the drawings.

Figure 24:
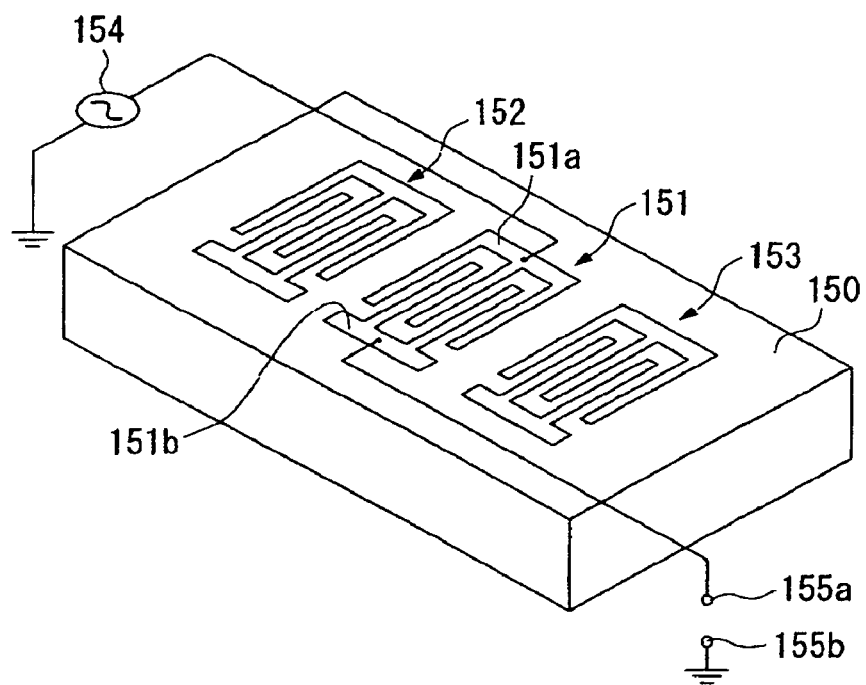
FIG. 24 is a perspective view showing an oscillator according to an application example of one embodiment of the invention.

FIG. 24 is a view schematically showing the oscillator according to this embodiment. As shown in FIG. 24, the oscillator includes a base 150. As the base 150, a laminate (see FIG. 22) similar to that of the above-described surface acoustic wave device 300 may be used.

An IDT electrode 151 is formed on the upper side of the base 150, and IDT electrodes 152 and 153 are formed so that the IDT electrode 151 is positioned between the IDT electrodes 152 and 153. A high-frequency signal source 154 is connected with a comb-shaped electrode 151a forming the IDT electrode 151, and a signal line is connected with the other comb-shaped electrode 151b. The IDT electrode 151 corresponds to an electrode for applying an electric signal, and the IDT electrodes 152 and 153 correspond to electrodes for causing a specific frequency component or a frequency component in a specific band of surface acoustic waves generated by the IDT electrode 151 to resonate. The IDT electrodes 151, 152, and 153 may be formed using the conductive complex oxide film according to the invention.

The operation of the oscillator is described below.

In the above-described configuration, when a high-frequency signal is output from the high-frequency signal source 154, the high-frequency signal is applied to the comb-shaped electrode 151a of the IDT electrode 151, whereby surface acoustic waves propagated toward the IDT electrode 152 and surface acoustic waves propagated toward the IDT electrode 153 are generated on the upper side of the base 150. The surface acoustic waves having a specific frequency component are reflected by the IDT electrodes 152 and 153 so that stationary waves occur between the IDT electrodes 152 and 153. The surface acoustic waves having a specific frequency component are repeatedly reflected by the IDT electrodes 152 and 153, whereby a specific frequency component or a frequency component in a specific band resonates to increase the amplitude. A part of the surface acoustic waves having the specific frequency component or the frequency component in the specific band is removed through the comb-shaped electrode 151b of the IDT electrode 151, whereby electric signals having a frequency corresponding to the resonant frequency of the IDT electrodes 152 and 153 (or frequency having a certain band) can be supplied to terminals 155a and 155b.

Figure 25:
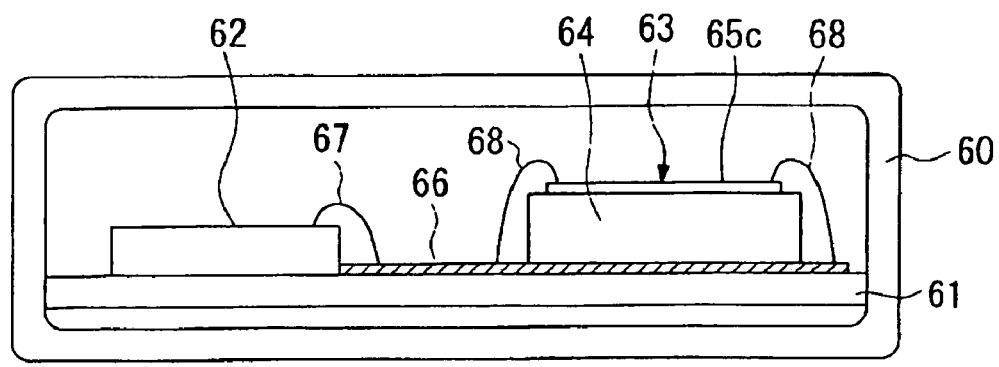
FIG. 25 is a schematic view showing an example in which an oscillator according to an application example of one embodiment of the invention is applied to a VCSO.
Figure 26:
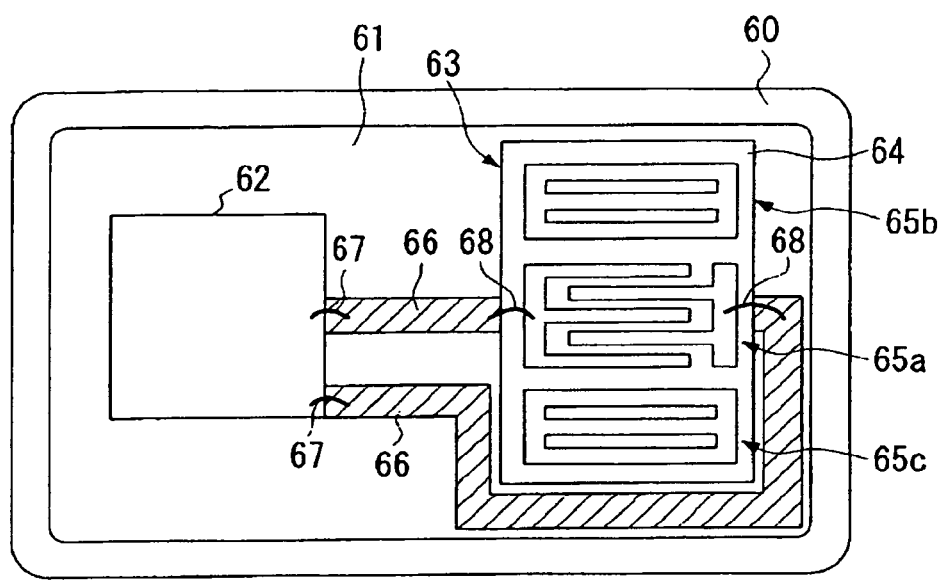
FIG. 26 is a schematic view showing an example in which an oscillator according to an application example of one embodiment of the invention is applied to a VCSO.

FIGS. 25 and 26 are views schematically showing an example in which the above-described oscillator is applied to a voltage controlled SAW oscillator (VCSO). FIG. 25 is a side perspective view, and FIG. 26 is a top perspective view.

The VCSO is provided in a housing 60 made of a metal (aluminum or stainless steel). An integrated circuit (IC) 62 and an oscillator 63 are provided on a substrate 61. In this case, the IC 62 is an oscillating circuit which controls the frequency applied to the oscillator 63 corresponding to the voltage value input from an external circuit (not shown).

In the oscillator 63, IDT electrodes 65a to 65c are formed on a base 64. The configuration of the oscillator 63 is substantially the same as the configuration of the oscillator shown in FIG. 24. As the base 64, a laminate similar to that of the oscillator shown in FIG. 24 may be used. The IDT electrodes 65a to 65c may be formed using the conductive complex oxide film according to the invention.

An interconnect 66 for electrically connecting the IC 62 with the oscillator 63 is patterned on the substrate 61. The IC 62 and the interconnect 66 are connected through a wire 67 such as a gold wire, and the oscillator 63 and the interconnect 66 are connected through a wire 68 such as a gold wire. This allows the IC 62 and the oscillator 63 to be electrically connected through the interconnect 66.

Figure 27:
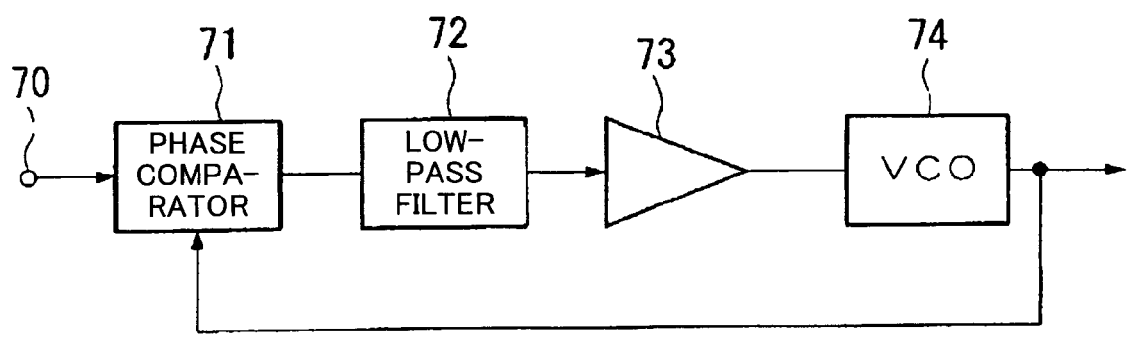
FIG. 27 is a block diagram showing the basic configuration of a PLL circuit according to an application example of one embodiment of the invention.

The VCSO shown in FIGS. 25 and 26 is used as a voltage controlled oscillator (VCO) of a PLL circuit shown in FIG. 27, for example. FIG. 27 is a block diagram showing a basic configuration of the PLL circuit. The PLL circuit includes a phase comparator 71, a low-pass filter 72, an amplifier 73, and a VCO 74. The phase comparator 71 compares the phase (or frequency) of a signal input through an input terminal 70 with the phase (or frequency) of a signal output from the VCO 74, and generates an error voltage signal of which the value is set corresponding to the difference. The low-pass filter 72 allows only a low-frequency component at a position of the error voltage signal output from the phase comparator 71 to pass therethrough. The amplifier 73 amplifies the signal output from the low-pass filter 72. The VCO 74 is an oscillating circuit of which the oscillation frequency continuously changes within a certain range corresponding to the input voltage value.

The PLL circuit having such a configuration operates so that the difference between the phase (or frequency) of the signal input through the input terminal 70 and the phase (or frequency) of the signal output from the VCO 74 is decreased, and synchronizes the frequency of the signal output from the VCO 74 with the frequency of the signal input through the input terminal 70. When the frequency of the signal output from the VCO 74 has been synchronized with the frequency of the signal input through the input terminal 70, the PLL circuit outputs a signal which coincides with the signal input through the input terminal 70 excluding a specific phase difference and follows a change in the input signal.

As described above, the frequency filter and the oscillator according to this embodiment include the surface acoustic wave device according to the invention having a high electromechanical coupling factor. Therefore, this embodiment allows a reduction in the size of the frequency filter and the oscillator.

5.7. First Electronic Instrument

Figure 28:
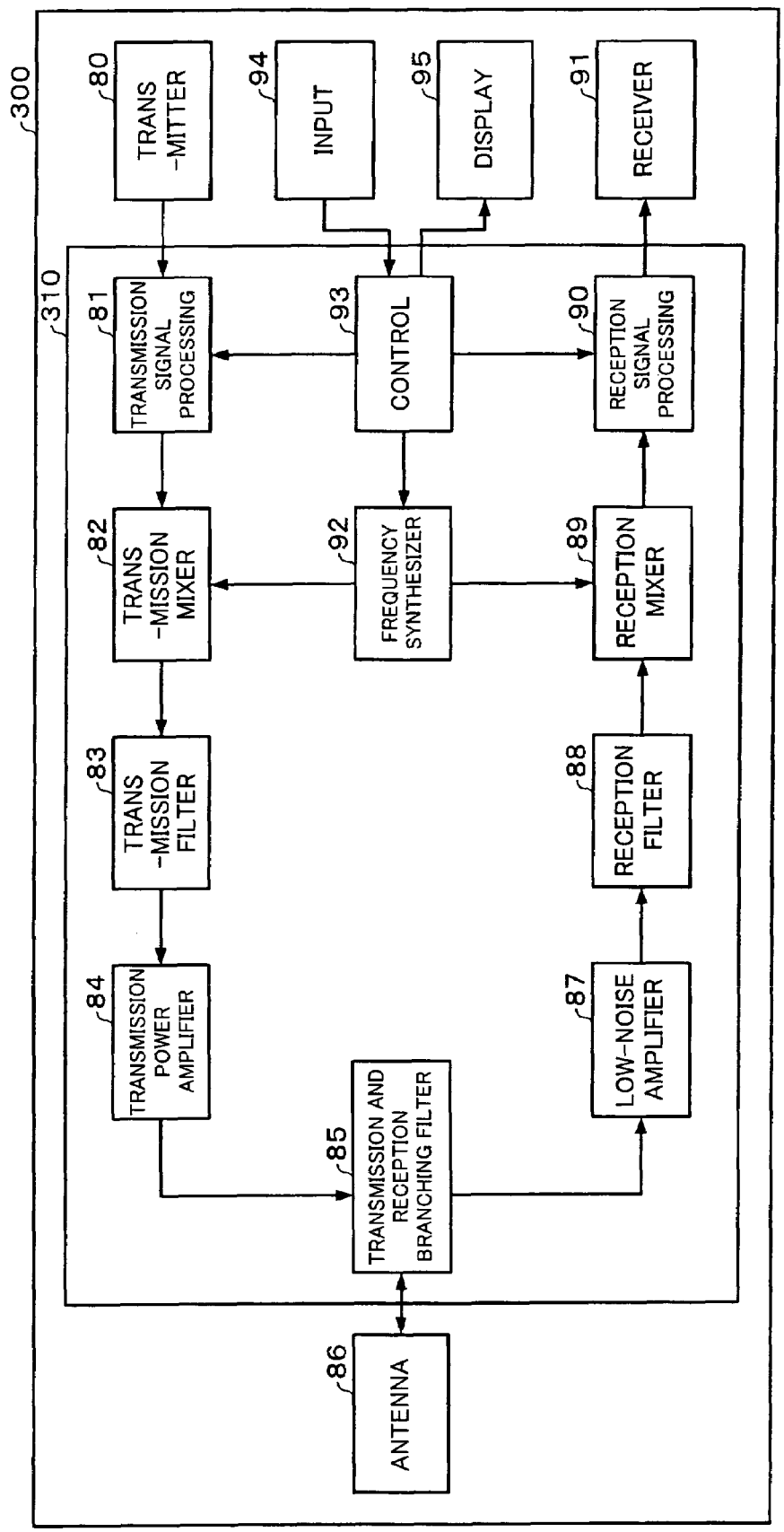
FIG. 28 is a block diagram showing the configuration of an electronic circuit according to an application example of one embodiment of the invention.

A first example of an electronic circuit and an electronic instrument to which the invention is applied is described below with reference to the drawings. FIG. 28 is a block diagram showing the electrical configuration of an electronic instrument according to this embodiment. The electronic instrument is a portable telephone, for example.

An electronic instrument 300 includes an electronic circuit 310, a transmitter 80, a receiver 91, an input section 94, a display section 95, and an antenna section 86. The electronic circuit 310 includes a transmission signal processing circuit 81, a transmission mixer 82, a transmission filter 83, a transmission power amplifier 84, a transmission and reception branching filter 85, a low-noise amplifier 87, a reception filter 88, a reception mixer 89, a reception signal processing circuit 90, a frequency synthesizer 92, and a control circuit 93.

In the electronic circuit 310, the frequency filter shown in FIG. 23 may be used as the transmission filter 83 and the reception filter 88. The frequency to be filtered (frequency allowed to pass) is individually set for the transmission filter 83 and the reception filter 88 corresponding to the necessary frequency of the signal output from the transmission mixer 82 and the frequency necessary for the reception mixer 89. As the VCO 74 of the PLL circuit (see FIG. 27) provided in the frequency synthesizer 92, the oscillator shown in FIG. 24 or the VCSO shown in FIGS. 25 and 26 may be used.

The transmitter 80 is realized by a microphone which converts a sound wave signal into an electric signal, for example. The transmission signal processing circuit 81 is a circuit which performs processing such as D/A conversion or modulation for an electric signal output from the transmitter 80. The transmission mixer 82 mixes the signal output from the transmission signal processing circuit 81 by using the signal output from the frequency synthesizer 92. The transmission filter 83 allows only a signal having a frequency for which an intermediate frequency (hereinafter abbreviated as "IF") is necessary to pass therethrough, and removes a signal having an unnecessary frequency. The signal output from the transmission filter 83 is converted into an RF signal by a conversion circuit (not shown). The transmission power amplifier 84 amplifies electric power of the RF signal output from the transmission filter 83, and outputs it to the transmission and reception branching filter 85.

The transmission and reception branching filter 85 outputs the RF signal output from the transmission power amplifier 84 to the antenna section 86, and transmits the RF signal from the antenna section 86 as radio waves. The transmission and reception branching filter 85 branches a signal received by the antenna section 86, and outputs the resulting signal to the low-noise amplifier 87. The low-noise amplifier 87 amplifies the signal received from the transmission and reception branching filter 85. The signal output from the low-noise amplifier 87 is converted into an IF by a conversion circuit (not shown).

The reception filter 88 allows only a signal having a frequency for which an IF converted by the conversion circuit (not shown) is necessary to pass therethrough, and removes a signal having an necessary frequency. The reception mixer 89 mixes the signal output from the reception filter 88 by using the signal output from the frequency synthesizer 92. The reception signal processing circuit 90 is a circuit which performs processing such as A/D conversion or demodulation for the signal output from the reception mixer 89. The receiver 91 is realized by a small speaker which converts electric signals into sound waves, for example.

The frequency synthesizer 92 is a circuit which generates a signal supplied to the transmission mixer 82 and a signal supplied to the reception mixer 89. The frequency synthesizer 92 includes a PLL circuit, and generates a signal by dividing the frequency of a signal output from the PLL circuit. The control circuit 93 controls the transmission signal processing circuit 81, the reception signal processing circuit 90, the frequency synthesizer 92, the input section 94, and the display section 95. The display section 95 displays the state of the instrument to the user of the portable telephone, for example. The input section 94 allows the user of the portable telephone to input instructions, for example.

5.8. Second Electronic Instrument

Figure 29:
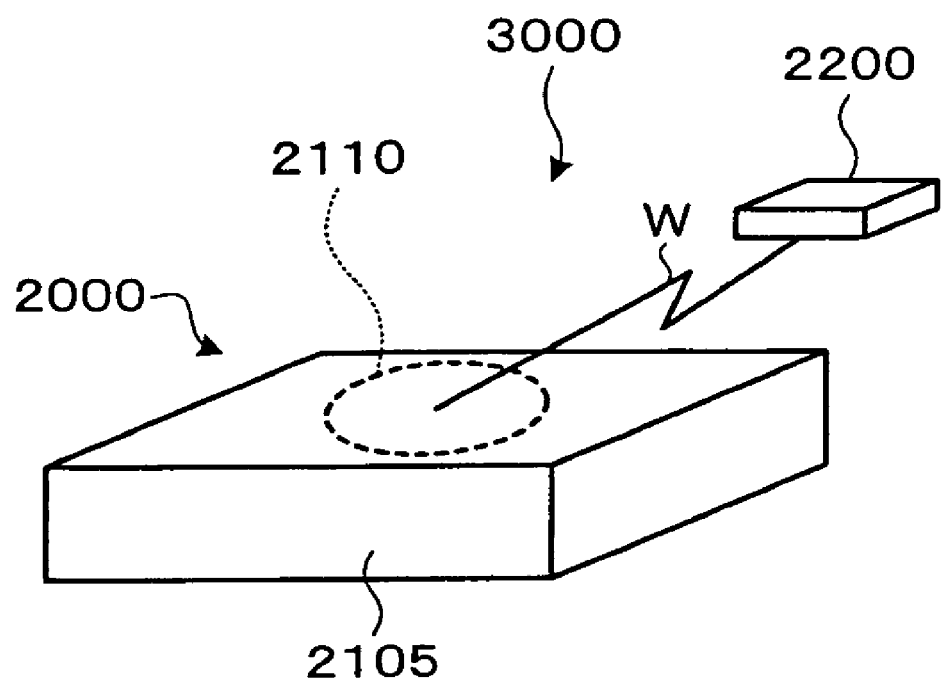
FIG. 29 is a view showing a communication system using a reader/writer according to an application example of one embodiment of the invention.
Figure 30:
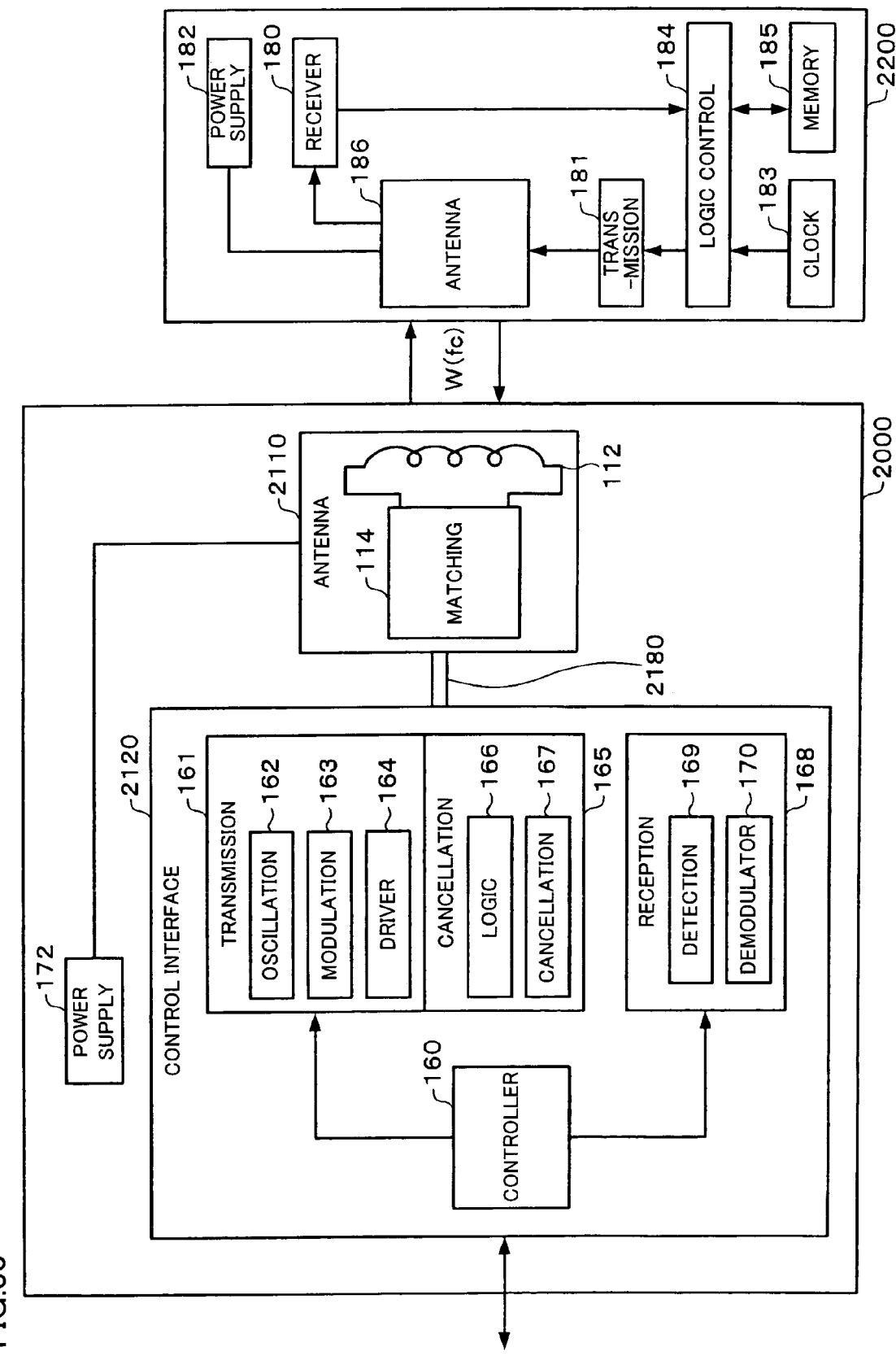
FIG. 30 is a schematic block diagram of the communication system shown in FIG. 29.

A second example of an electronic circuit and an electronic instrument to which the invention is applied is described below with reference to the drawings. In this embodiment, a reader/writer 2000 and a communication system 3000 using the reader/writer 2000 are described as an example of the electronic instrument. FIG. 29 is a view showing the communication system 3000 using the reader/writer 2000 according to this embodiment, and FIG. 30 is a schematic block diagram of the communication system 3000 shown in FIG. 29.

As shown in FIG. 29, the communication system 3000 includes the reader/writer 2000 and a contactless information medium 2200. The reader/writer 2000 transmits or receives radio waves W (hereinafter may be called "carrier") having a carrier frequency $f_c$ to or from the contactless information medium 2200, and communicates with the contactless information medium 2200 using wireless communication. The carrier frequency $f_c$ of the radio wave W may be a carrier frequency in an arbitrary frequency band. As shown in FIGS. 29 and 30, the reader/writer 2000 includes a main body 2105, an antenna section 2110 positioned on the upper side of the main body 2105, a control interface section 2120 provided in the main body 2105, and a power supply circuit 172. The antenna section 2110 and the control interface section 2120 are electrically connected through a cable 2180. The reader/writer 2000 is connected with an external host device (e.g. processing device) through the control interface section 2120 (not shown).

The antenna section 2110 has the function of transmitting and receiving information to and from the contactless information medium 2200. As shown in FIG. 29, the antenna section 2110 has a specific communication area (area indicated by the dotted line). The antenna section 2110 includes a loop antenna 112 and a matching circuit 114.

The control interface section 2120 includes a transmission section 161, a damped oscillation cancellation section (hereinafter called "cancellation section") 140, a reception section 168, and a controller 160.

The transmission section 161 modulates data transmitted from an external device (not shown), and transmits the modulated data to the loop antenna 112. The transmission section 161 includes an oscillation circuit 162, a modulation circuit 163, and a driver circuit 164. The oscillation circuit 162 is a circuit for generating a carrier having a specific frequency. The oscillation circuit 162 is generally formed using a quartz oscillator or the like. The communication frequency and the detection sensitivity can be increased by using the oscillator according to the invention. The modulation circuit 163 is a circuit which modulates the carrier according to information provided. The driver circuit 164 receives the modulated carrier and amplifies electric power to drive the antenna section 2110.

The cancellation section 165 has the function of reducing the damped oscillation caused by the loop antenna 112 of the antenna section 2110 along with turning the carrier ON/OFF. The cancellation section 165 includes a logic circuit 166 and a cancellation circuit 167.

The reception section 168 includes a detection section 169 and a demodulator circuit 170. The reception section 168 restores a signal transmitted from the contactless information medium 2200. The detection section 169 detects a change in current which flows through the loop antenna 112, for example. The demodulator circuit 170 is a circuit which demodulates the change detected by the detection section 169.

The controller 160 acquires information from the demodulated signal and transfers the information to the external device. The power supply circuit 172 receives power from the outside, arbitrarily performs voltage conversion, and supplies necessary power to each circuit. A built-in cell may be used as the power supply. The contactless information medium 2200 communicates with the reader/writer 2000 using electromagnetic waves (radio waves). As examples of the contactless information medium 2200, a contactless IC tag, a contactless IC card, and the like can be given.

The operation of the communication system 3000 using the reader/writer 2000 according to this embodiment is described below. When data is transferred to the contactless information medium 2200 from the reader/writer 2000, data from the external device (not shown) is processed by the controller 160 of the reader/writer 2000, and transmitted to the transmission section 161. In the transmission section 161, a high-frequency signal having a specific amplitude is supplied as the carrier from the oscillation circuit 162. The carrier is modulated by the modulation circuit 163 so that the modulated high-frequency signal is output. The modulated high-frequency signal output from the modulation circuit 163 is supplied to the antenna section 2110 through the driver circuit 164. The cancellation section 165 generates a specific pulse signal in synchronization with the OFF timing of the modulated high-frequency signal to contribute to a reduction in the damped oscillation in the loop antenna 112.

In the contactless information medium 2200, the modulated high-frequency signal is supplied to the receiver circuit 180 through the antenna section 186. The modulated high-frequency signal is also supplied to the power supply circuit 182 so that a specific power supply voltage necessary for each section of the contactless information medium 2200 is generated. The data output from the receiver circuit 180 is demodulated and supplied to the logic control circuit 184. The logic control circuit 184 operates based on the output from a clock 183. The logic control circuit 184 processes the supplied data and writes specific data into a memory 185.

When data is transferred to the reader/writer 2000 from the contactless information medium 2200, an unmodulated high-frequency signal having a specific amplitude is output from the modulation circuit 163 of the reader/writer 2000. The high-frequency signal is transferred to the contactless information medium 2200 through the driver circuit 164 and the loop antenna 112 of the antenna section 2110.

In the contactless information medium 2200, the data read from the memory 185 is processed by the logic control circuit 184 and supplied to the transmission circuit 181. In the transmission circuit 181, the switch is turned ON/OFF depending on the "1" or "0" bit of the data.

In the reader/writer 2000, the load of the loop antenna 112 of the antenna section 2110 changes when the switch of the transmission circuit 181 is turned ON/OFF. Therefore, the amplitude of the high frequency current which flows through the loop antenna 112 changes. Specifically, the amplitude of the high frequency current is modulated by the data supplied from the contactless information medium 2200. The high frequency current is detected by the detection section 169 of the reception section 168 and demodulated by the demodulator circuit 170 to obtain data. The data is processed by the controller 160 and transmitted to the external device or the like.

Although only some embodiments of the invention have been described in detail above, those skilled in the art would readily appreciate that many modifications are possible in the embodiments without materially departing from the novel teachings and advantages of the invention. For example, the frequency filter and the oscillator according to the invention may be respectively applied to a broadband filter and a VCO in a UWB system, portable telephone, wireless LAN, and the like.

In the above-described embodiments, the communication system using the portable telephone and the reader/writer is described as an example of the device, and the electronic circuit provided in the portable telephone and the reader/writer is described as an example of the electronic circuit. However, the invention is not limited thereto. The invention may be applied to various mobile communication instruments and electronic circuits provided therein. For example, the invention may also be applied to communication instruments used in a stationary state such as a tuner which receives broadcast satellite (BS) broadcasts and electronic circuits provided therein, and devices such as a HUB using an optical signal propagated through an optical cable and electronic circuits provided therein.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A method of manufacturing an insulating target material for obtaining a conductive complex oxide film represented by a general formula $ABO_3$, the method comprising:
   mixing an oxide of an element A and an oxide of an element B, heat-treating the resulting mixed powder, and pulverizing the resulting product to obtain a first powder;
   mixing the first powder and a solution including at least one of an Si raw material and a Ge raw material, and collecting the resulting powder to obtain a second powder;
   heat-treating the second powder and pulverizing the resulting product to obtain a third powder; and
   heat-treating the third powder.

2. The method of manufacturing an insulating target material as defined in claim 1,
   wherein the solution includes at least one of the Si raw material and the Ge raw material in an amount of 2 to 10 mol %.

3. The method of manufacturing an insulating target material as defined in claim 1, wherein the mixed powder is heat-treated at 900 to 1000° C.

4. The method of manufacturing an insulating target material as defined in claim 1, wherein the second powder is heat-treated at 900 to 1000° C.

5. The method of manufacturing an insulating target material as defined in claim 1, wherein the third powder is heat-treated at 1000 to 1500° C.

* * * * *